(12) United States Patent
Aoki et al.

(10) Patent No.: US 9,000,842 B2
(45) Date of Patent: Apr. 7, 2015

(54) AMPLIFYING APPARATUS AND CONTROL METHOD

(71) Applicant: Fujitsu Limited, Kawasaki-shi (JP)

(72) Inventors: Nobuhisa Aoki, Kawasaki (JP); Michiharu Nakamura, Yokosuka (JP)

(73) Assignee: Fujitsu Limited, Kawasaki (JP)

( * ) Notice: Subject to any disclaimer, the term of this patent is extended or adjusted under 35 U.S.C. 154(b) by 82 days.

(21) Appl. No.: 13/741,944

(22) Filed: Jan. 15, 2013

(65) Prior Publication Data
US 2013/0241642 A1 Sep. 19, 2013

(30) Foreign Application Priority Data

Mar. 15, 2012 (JP) .................................. 2012-059492

(51) Int. Cl.
*H03G 1/00* (2006.01)
*H03F 1/02* (2006.01)

(52) U.S. Cl.
CPC ............... *H03G 1/00* (2013.01); *H03F 1/0288* (2013.01)

(58) Field of Classification Search
USPC .................. 330/124 R, 295, 84, 286, 53, 136
See application file for complete search history.

(56) References Cited

U.S. PATENT DOCUMENTS

| 7,109,792 B2 * | 9/2006 | Leffel ........................... 330/149 |
| 8,274,332 B2 * | 9/2012 | Cho et al. ...................... 330/295 |
| 8,344,799 B2 | 1/2013 | Hayakawa |
| 8,519,787 B2 * | 8/2013 | Murao ..................... 330/124 R |

FOREIGN PATENT DOCUMENTS

JP 2010-114539 5/2010

* cited by examiner

Primary Examiner — Hieu Nguyen
(74) Attorney, Agent, or Firm — Fujitsu Patent Center

(57) ABSTRACT

An amplifying apparatus includes an amplifying unit that includes multiple amplifiers coupled in parallel; a measuring unit that measures in a predetermined period, frequency distribution of any one among instantaneous power and instantaneous voltage of a signal amplified by the amplifying unit; a calculating unit that calculates for multiple candidate values of a predetermined parameter of the amplifying unit, efficiency of amplification that is performed by the amplifying unit and based on the frequency distribution; and a controller that controls the predetermined parameter, based on the efficiency calculated for the candidate values by the calculating unit.

17 Claims, 22 Drawing Sheets

FIG.3
| TIME | INSTANTANEOUS POWER |
|---|---|
| t1 | P1 |
| t2 | P2 |
| t3 | P3 |
| ⋮ | ⋮ |
| tn | Pn |
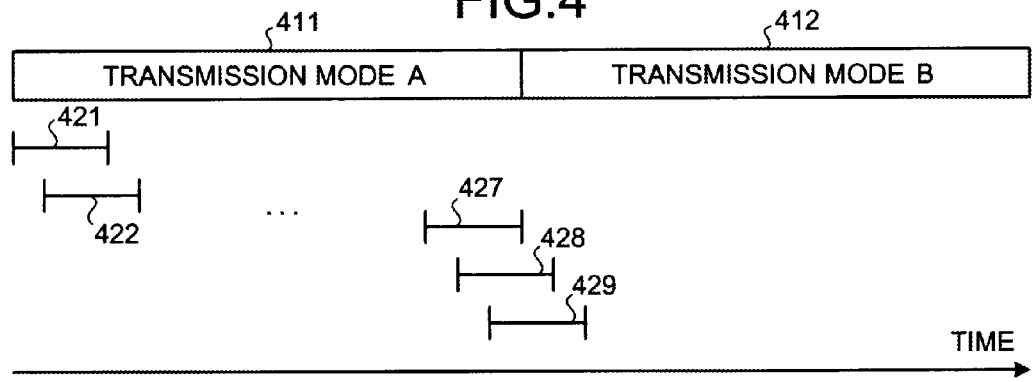
FIG.4
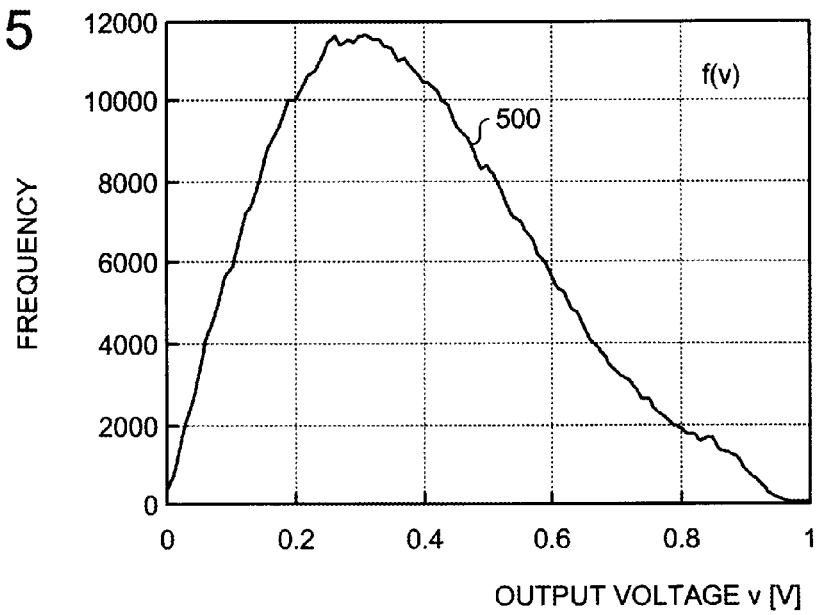
FIG.5

| INTERMEDIATE EFFICIENCY PEAK POINT | TOTAL EFFICIENCY |
|---|---|
| α1 | X1 |
| α2 | X2 |
| α3 | X3 |
| ⋮ | ⋮ |
| αm | Xm |

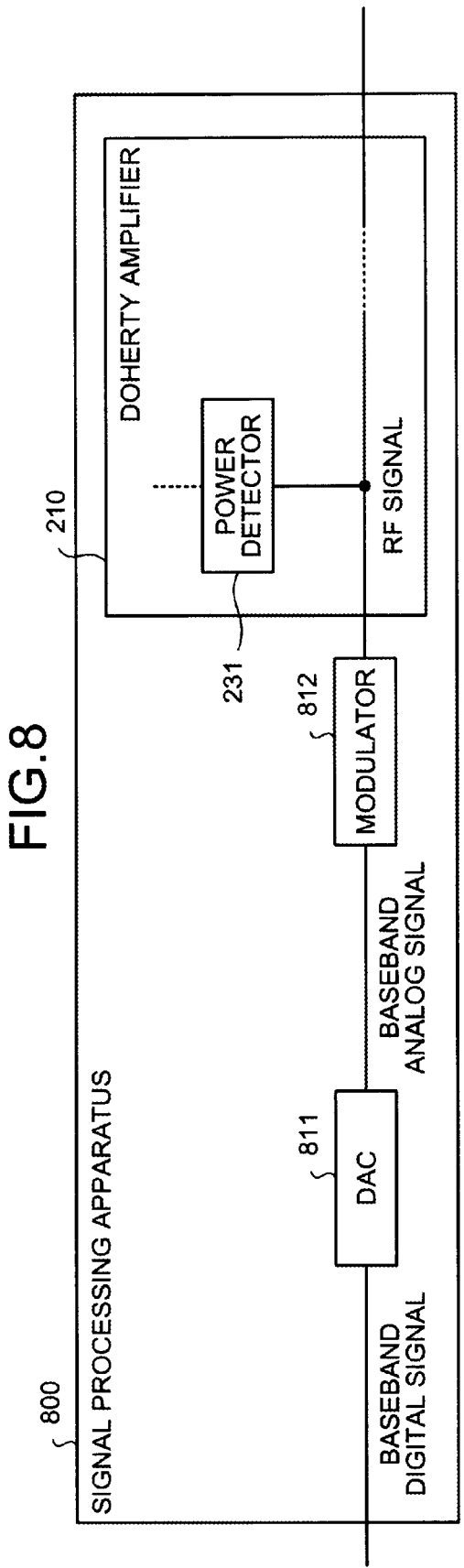

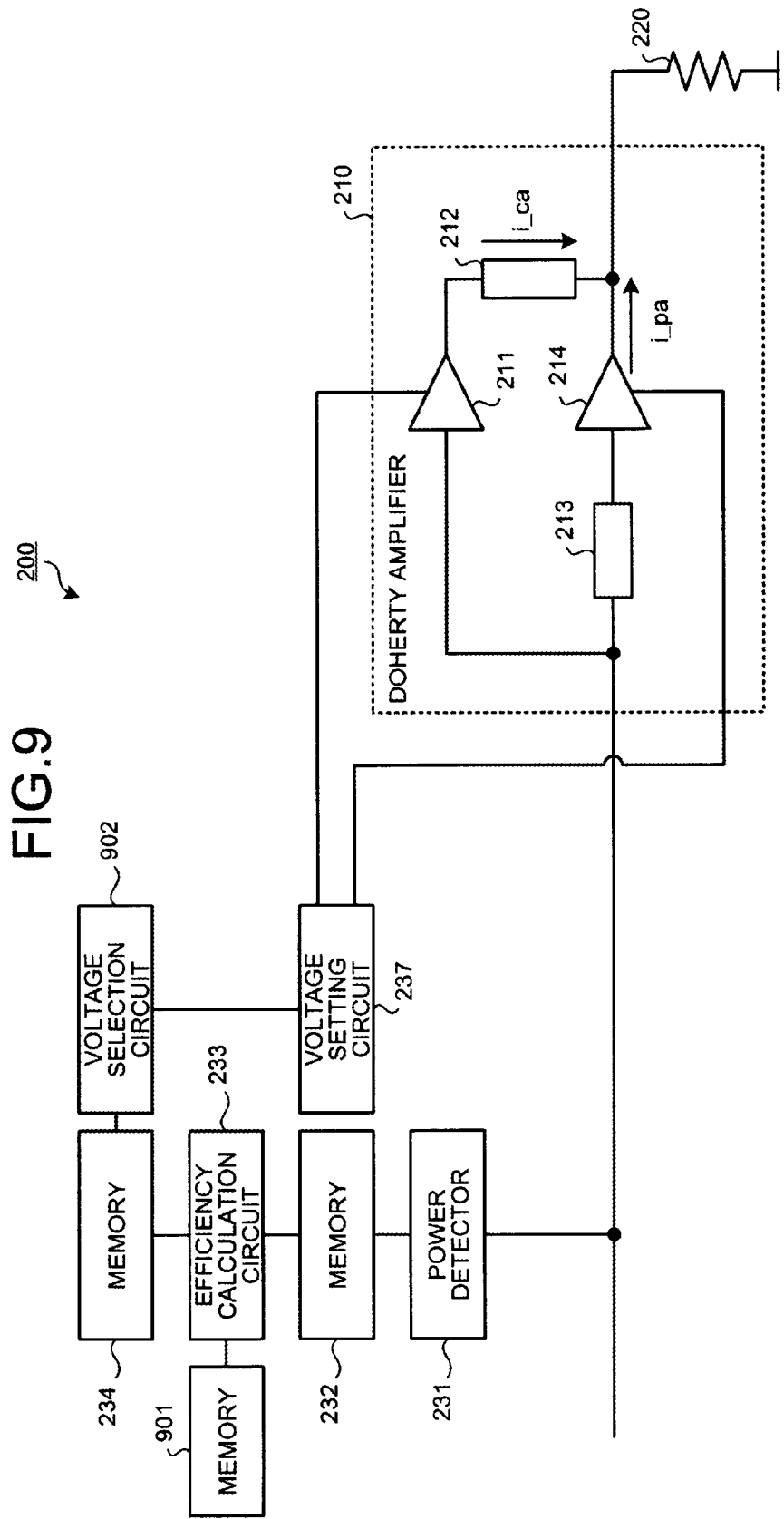

FIG.10

| INSTANTANEOUS POWER | INSTANTANEOUS EFFICIENCY $\eta$ | VOLTAGES $v\_ca, v\_pa$ | CURRENTS $I\_ca, I\_pa$ |
|---|---|---|---|
| P1 | $\eta(v\_11ca, v\_11pa)$ | $(v\_11ca, v\_11pa)$ | $(I\_11ca, I\_11pa)$ |
|  | ⋮ | ⋮ | ⋮ |
|  | $\eta(v\_1nca, v\_1npa)$ | $(v\_1nca, v\_1npa)$ | $(I\_1nca, I\_1npa)$ |
| P2 | $\eta(v\_21ca, v\_21pa)$ | $(v\_21ca, v\_21pa)$ | $(I\_21ca, I\_21pa)$ |
|  | ⋮ | ⋮ | ⋮ |
|  | $\eta(v\_2nca, v\_2npa)$ | $(v\_2nca, v\_2npa)$ | $(I\_2nca, I\_2npa)$ |
| ⋮ | ⋮ | ⋮ | ⋮ |

FIG.11

| VOLTAGES $v\_ca, v\_pa$ | TOTAL EFFICIENCY |
|---|---|
| $(v\_1ca, v\_1pa)$ | X1 |
| $(v\_2ca, v\_2pa)$ | X2 |
| $(v\_3ca, v\_3pa)$ | X3 |
| ⋮ | ⋮ |
| $(v\_nca, v\_npa)$ | Xm |

FIG.14

| MULTI-PLEX MODE | MODU-LATION MODE | TRANSMISSION SIGNAL INFORMATION | MEASURE-MENT SECTION | INSTANTANEOUS POWER DISTRIBUTION NUMBER |
|---|---|---|---|---|
| OFDM | QPSK | SUBCARRIER COUNT: 10 PAPR: 10 [dB] | 1 SYMBOL | 1 |
| ⋮ | ⋮ | ⋮ | ⋮ | ⋮ |
| CDM | 16QAM | BAND: 10 [MHz] PAPR: 8 [dB] | 1 FRAME | 1 |
| ⋮ | ⋮ | ⋮ | ⋮ | ⋮ |
| FDM | GMSK | MULTIPLEXING COUNT: 3 | 1 FRAME | 2 |
| ⋮ | ⋮ | ⋮ | ⋮ | ⋮ |

FIG.15

| INSTANTANEOUS POWER DISTRIBUTION NUMBER | VOLTAGES v_ca, v_pa |
|---|---|
| 1 | (v_1ca, v_1pa) |
| 2 | (v_2ca, v_2pa) |
| 3 | (v_3ca, v_3pa) |
| ⋮ | ⋮ |
| n | (v_nca, v_npa) |

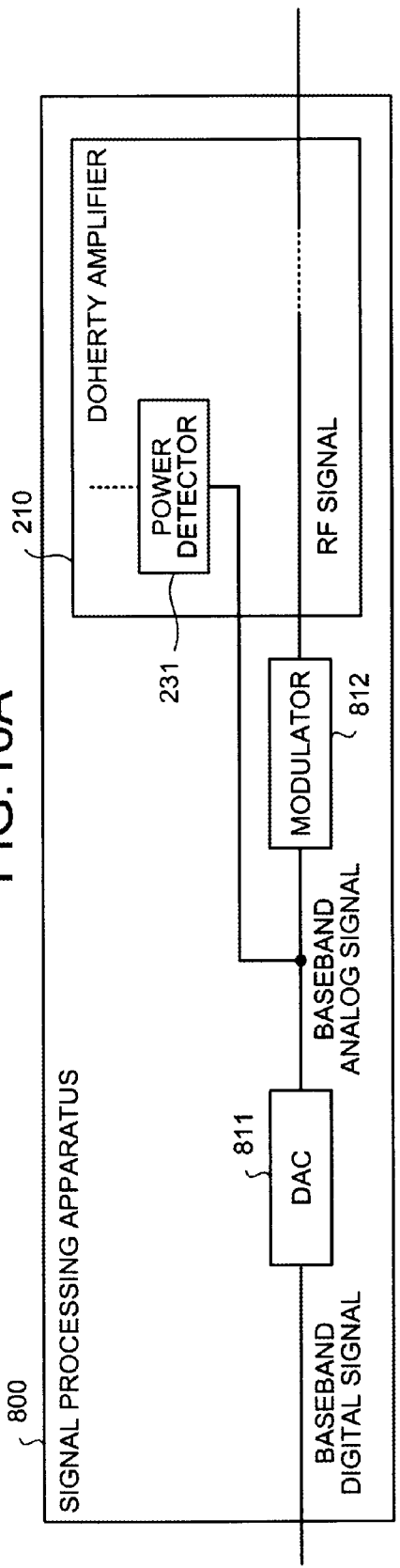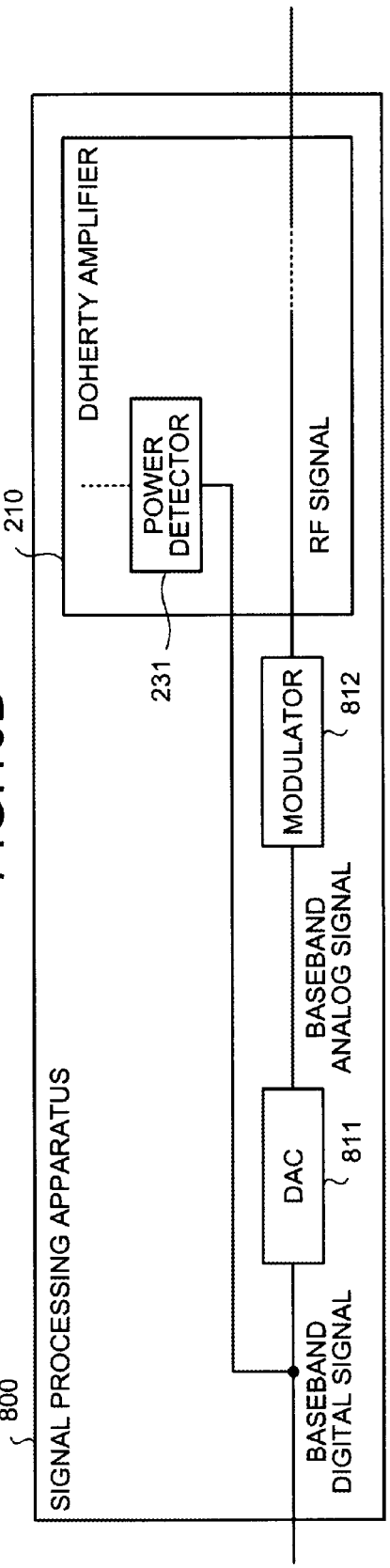

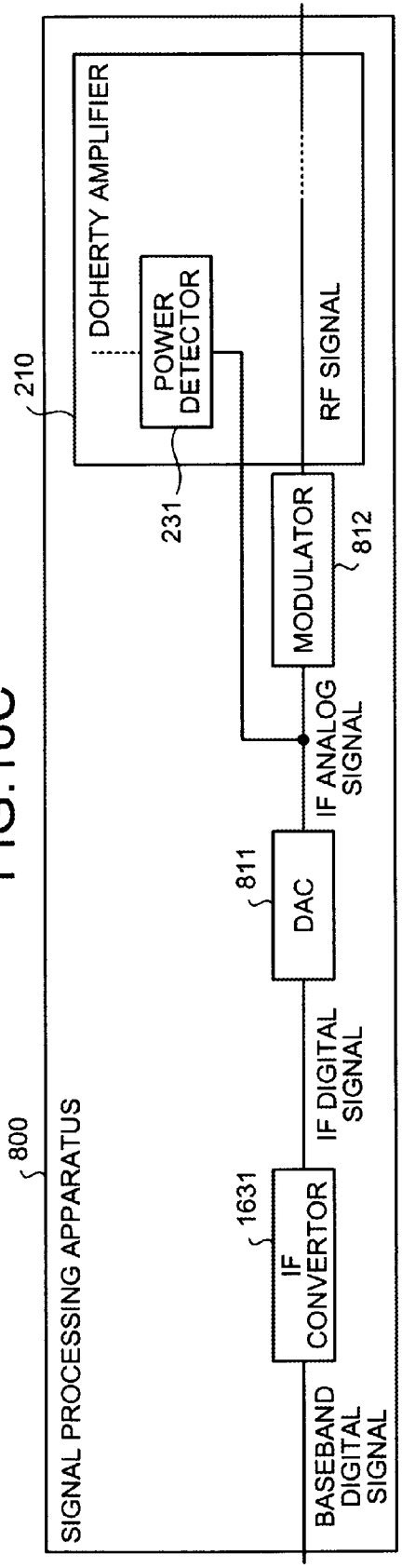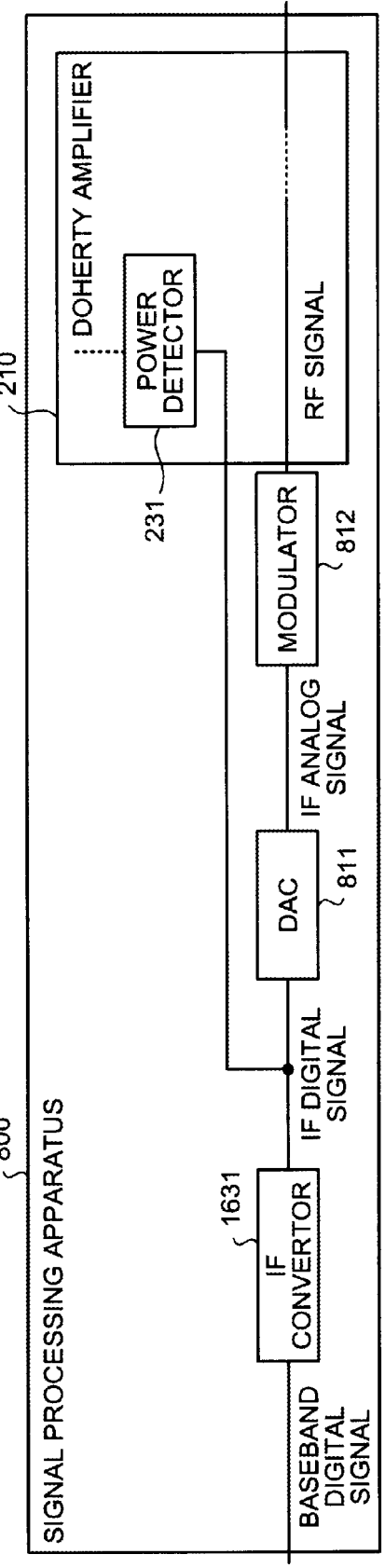

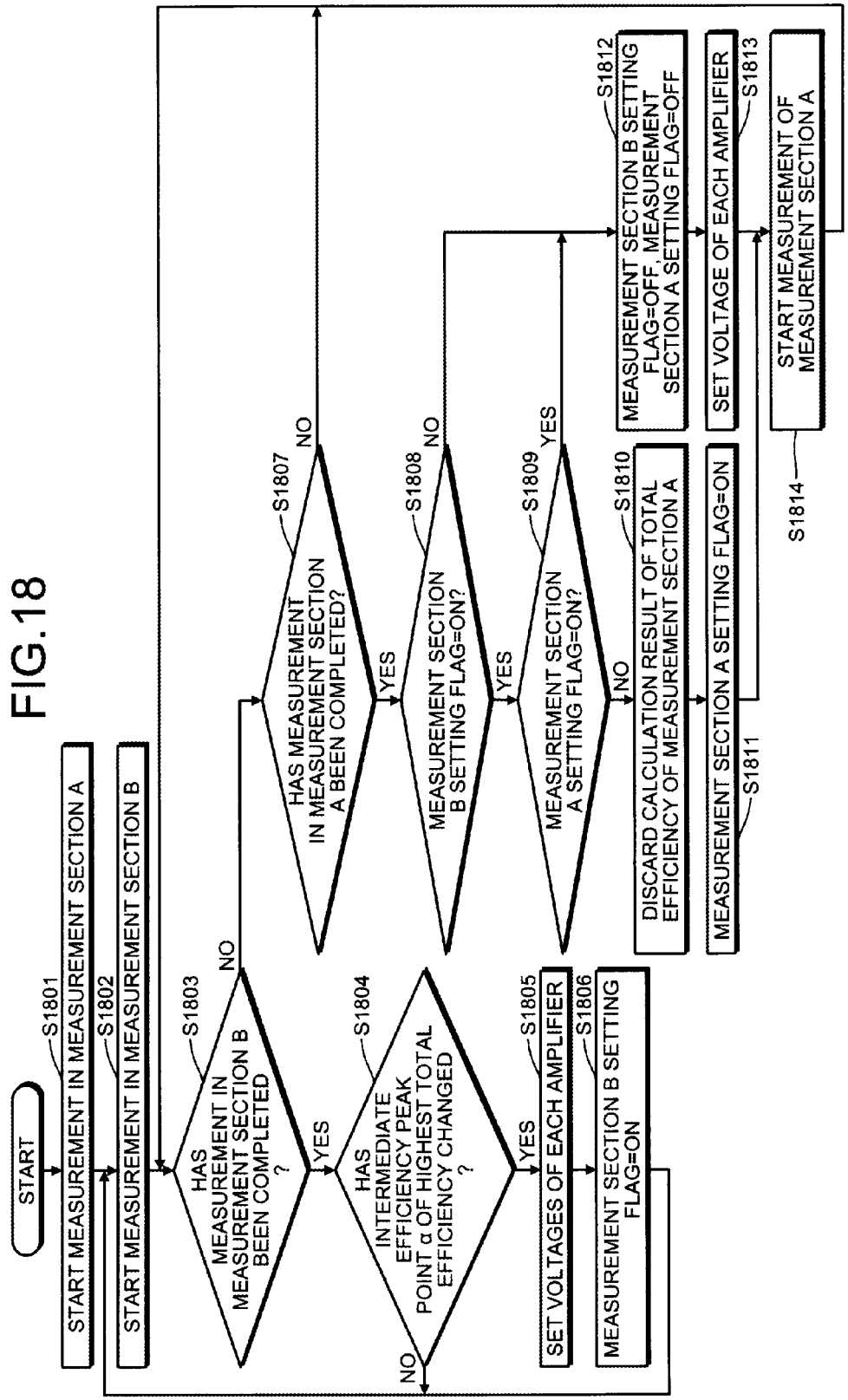

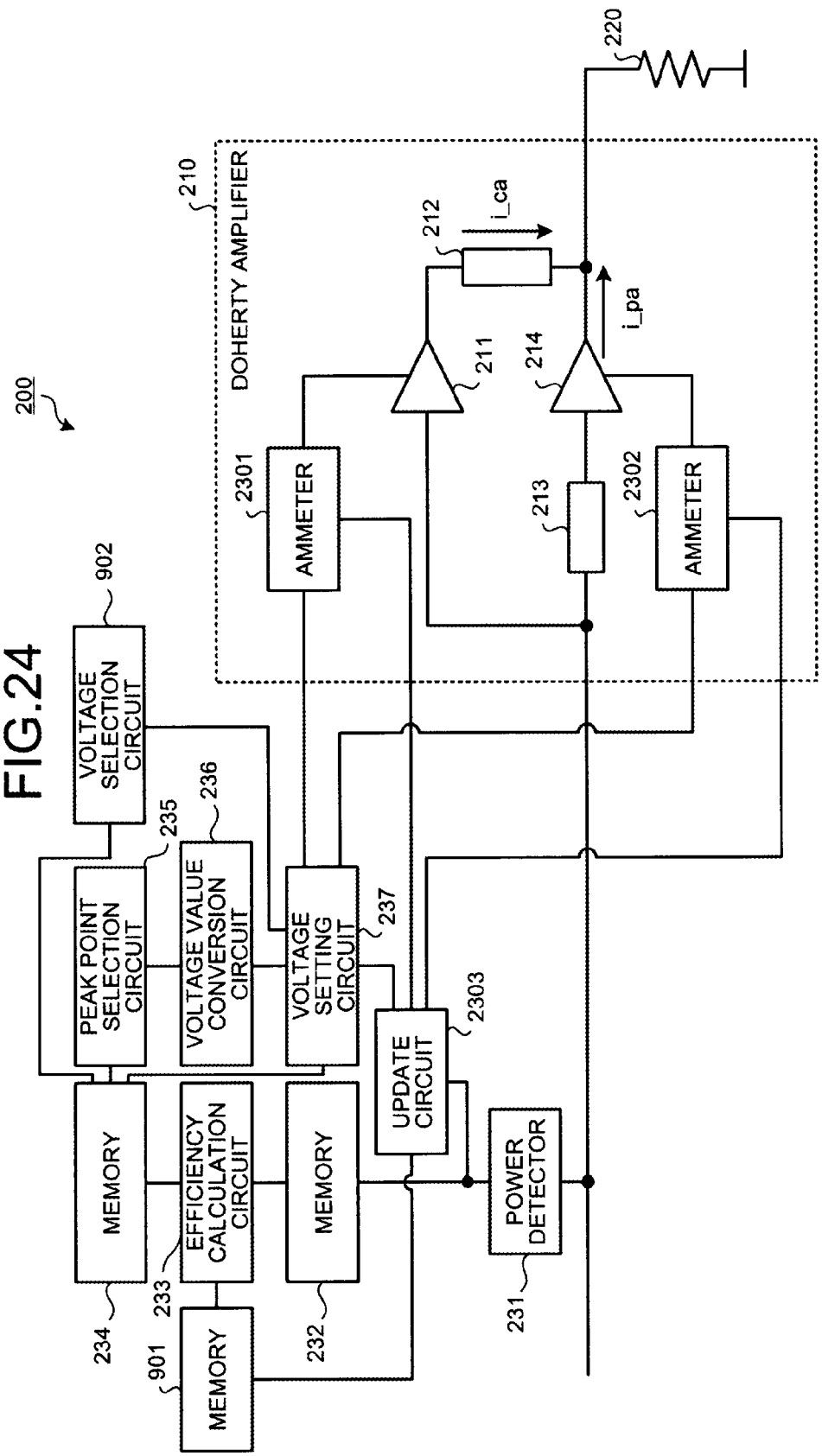

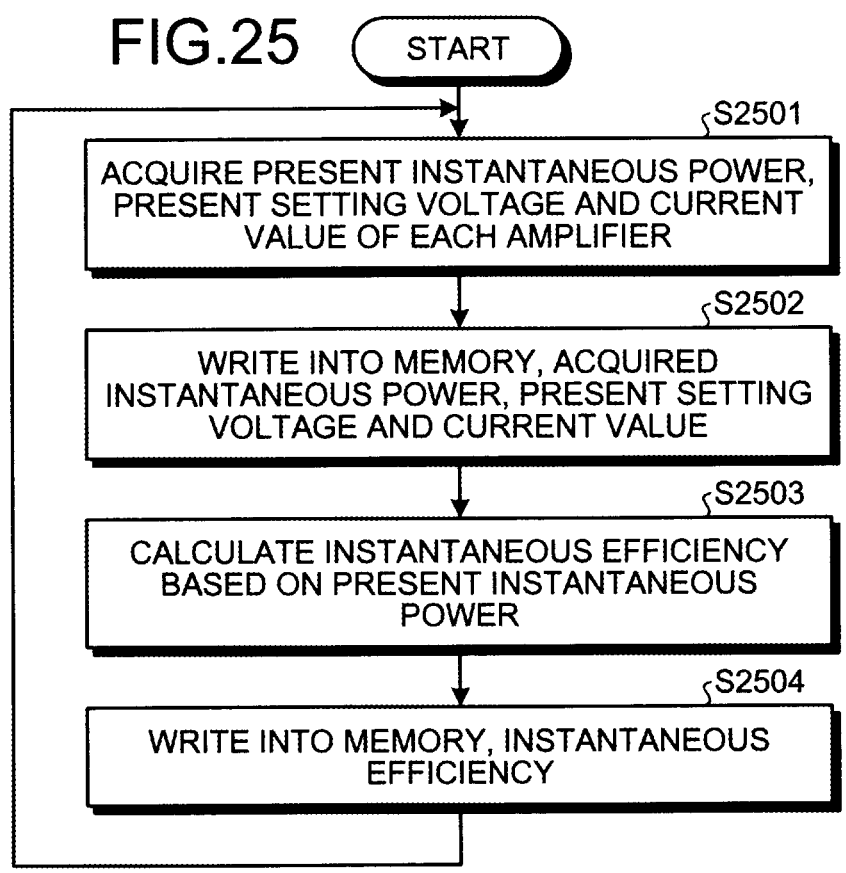

AMPLIFYING APPARATUS AND CONTROL METHOD

CROSS-REFERENCE TO RELATED APPLICATIONS

This application is based upon and claims the benefit of priority of the prior Japanese Patent Application No. 2012-059492, filed on Mar. 15, 2012, the entire contents of which are incorporated herein by reference.

FIELD

The embodiments discussed herein are related to an amplifying apparatus and a control method.

BACKGROUND

In a communicating apparatus, for example, a Doherty amplifier is conventionally used to amplify high-frequency signals. With respect to efficiency characteristics in terms of output power of the Doherty amplifier, peak points of efficiency exist at an intermediate point and a maximum point of output power. For example, in the Doherty amplifier, if drain voltage of a carrier amplifier changes, the output power of the peak point varies, and if drain voltage of a peak amplifier changes, the output power of the maximum point varies.

In the Doherty amplifier, for example, the drain voltage of the carrier amplifier is set based on the average power of input signals and the drain voltage of the peak amplifier is set based on the peak power of input signals (see, e.g., Japanese Laid-Open Patent Publication No. 2010-114539). If a modulation mode or a signal multiplex mode (e.g., the number of carriers) of a transmission signal changes, a peak-to-average power ratio (PARK) varies. Therefore, efficiency characteristics for output power in the Doherty amplifier have to be controlled according to the properties of the signals.

However, since voltage is controlled based on the average power of the input signals in the conventional technique described above, the properties of the input signals are not reflected in the control of the voltage and the efficiency of amplification may not be controlled accurately.

SUMMARY

According to an aspect of an embodiment, an amplifying apparatus includes an amplifying unit that includes multiple amplifiers coupled in parallel; a measuring unit that measures in a predetermined period, frequency distribution of any one among instantaneous power and instantaneous voltage of a signal amplified by the amplifying unit; a calculating unit that calculates for multiple candidate values of a predetermined parameter of the amplifying unit, efficiency of amplification that is performed by the amplifying unit and based on the frequency distribution; and a controller that controls the predetermined parameter, based on the efficiency calculated for the candidate values by the calculating unit.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 3 is a diagram of an example of an instantaneous power sequence;

FIG. 4 is a diagram of an example of a measurement section;

FIG. 5 is a diagram of an example of instantaneous power distribution;

FIG. 8 is a diagram of an example of a signal processing apparatus to which the amplifying apparatus is applied;

FIG. 9 is a diagram of an example of a configuration of the amplifying apparatus according to a second embodiment;

FIG. 10 is a diagram of an example of instantaneous efficiency characteristics for each instantaneous power of the Doherty amplifier;

FIG. 11 is a diagram of an example of a calculation result of total efficiency;

FIG. 14 is a diagram of an example of a relationship between signal properties and instantaneous power distribution number;

FIG. 15 is a diagram of an example of correlation information between the instantaneous power distribution number and a combination of the voltages;

FIG. 16A is a diagram of a first modification of a signal processing apparatus;

FIG. 16B is a diagram of a second modification of the signal processing apparatus;

FIG. 16C is a diagram of a third modification of the signal processing apparatus;

FIG. 16D is a diagram of a fourth modification of the signal processing apparatus;

FIG. 18 is a flowchart of an example of operation for control using the measurement sections depicted in FIG. 17C;

FIG. 24 is a diagram of a second modification of the amplifying apparatus; and

FIG. 25 is a flowchart of an example of an update operation of the amplifying apparatus depicted in FIG. 23 or 24.

DESCRIPTION OF EMBODIMENTS

Preferred embodiments of an amplifying apparatus and a control method will be explained with reference to the accompanying drawings.

Figure 1:
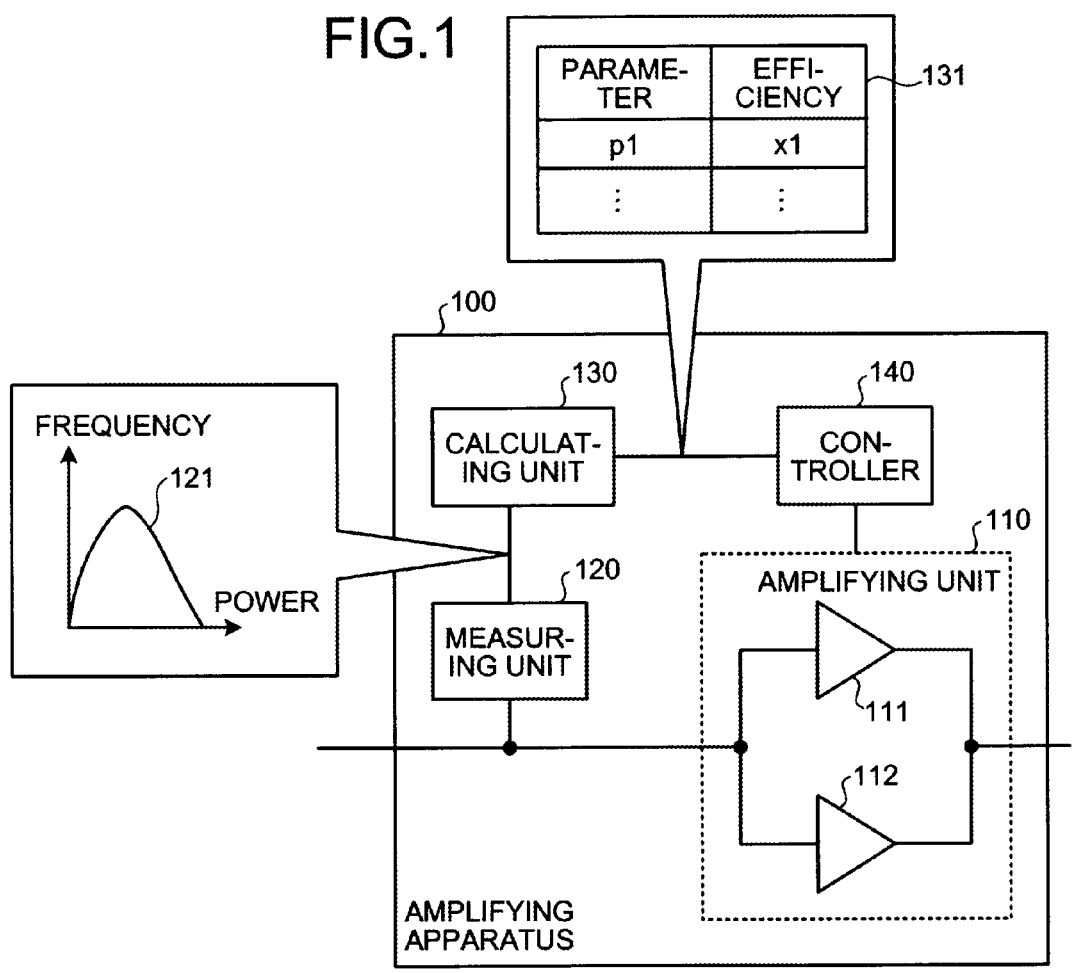
FIG. 1 is a diagram of an example of a configuration of an amplifying apparatus according to a first embodiment.

FIG. 1 is a diagram of an example of a configuration of an amplifying apparatus according to a first embodiment. An amplifying apparatus 100 depicted in FIG. 1 amplifies and outputs a signal input thereto. For example, the amplifying apparatus 100 includes an amplifying unit 110, a measuring unit 120, a calculating unit 130, and a controller 140.

The amplifying unit 110 includes amplifiers 111 and 112 (multiple amplifiers) coupled in parallel. Each of the amplifiers 111 and 112 amplifies and outputs signals input to the amplifying unit 110. The signals output from the amplifiers 111 and 112 are combined and output from the amplifying unit 110.

Figures 6, 7:
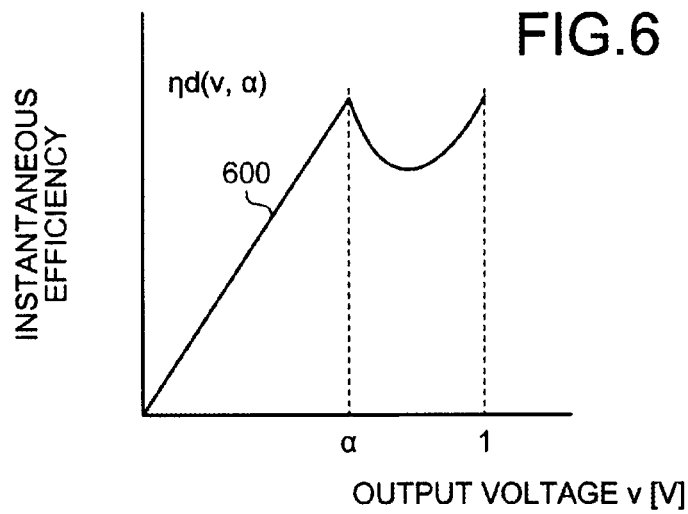
FIG. 6 is a diagram of an example of instantaneous efficiency characteristics of a Doherty amplifier.
FIG. 7 is a diagram of an example of a calculation result of total efficiency.

The amplifying unit 110 has multiple local maximum points (peak points) among the characteristics of efficiency of amplification (instantaneous efficiency) for output voltage (see. e.g., FIG. 6). For example, the amplification efficiency is a ratio of output to input and one example is drain efficiency or power added efficiency (PAE). The amplifying unit 110 is a Doherty amplifier, for example. The amplifying unit 110 amplifies a signal input to the amplifying apparatus 100 and outputs the signal amplified.

The measuring unit 120 measures frequency distribution 121 of instantaneous power of signals input to the amplifying unit 110 within a predetermined period. For example, the measuring unit 120 repeatedly detects the instantaneous power of the signals input to the amplifying unit 110 and tabulates the detection result of the instantaneous power within the predetermined period to measure the frequency distribution 121 of the instantaneous power. For example, the frequency distribution 121 of the instantaneous power is information indicative of the frequency (e.g., the number of times) of detection within a predetermined period for each value of the instantaneous power. The measuring unit 120 outputs the measured frequency distribution 121 to the calculating unit 130.

The calculating unit 130 calculates total efficiency (x1, . . . ) of amplification by the amplifying unit 110, in the frequency distribution 121 output from the measuring unit 120 for multiple candidate values (p1, . . . ) of a predetermined parameter of the amplifying unit 110 (reference numeral 131). For example, memory of the amplifying unit 110 stores the instantaneous power of a signal to be amplified, multiple candidate values of a predetermined parameter of the amplifying unit 110, and efficiency characteristic information (see, e.g., FIG. 6) indicative of characteristics of efficiency of amplification by the amplifying unit 110 for the multiple candidate values of the predetermined parameter of the amplifying unit 110. Based on the efficiency characteristic information stored in the memory, the calculating unit 130 calculates for the multiple candidate values of the predetermined parameter, the efficiency 131 of amplification by the amplifying unit 110, in the frequency distribution 121 over a predetermined period.

For example, the predetermined parameter is an intermediate efficiency peak point in the characteristics of instantaneous efficiency for the output voltage of the amplifying unit 110. The intermediate efficiency peak point is a non-maximum voltage of multiple output voltages corresponding to multiple local maximum points of the characteristics of instantaneous efficiency for output voltage (see, e.g., FIG. 6).

For example, if the efficiency of amplification of the amplifying unit 110 is locally maximized when the output voltage is voltages V1 and V2 (V1<V2), the predetermined parameter is the non-maximum voltage V1 among the voltages V1 and V2. A value of the voltage V1 causing a local maximum point of the efficiency of amplification can be controlled by the voltage supplied to at least one of the amplifiers 111 and 112, for example.

If the predetermined parameter is the intermediate efficiency peak point, the calculating unit 130 calculates for multiple candidate values of the intermediate efficiency peak point, the total efficiency of amplification of the amplifying unit 110 for a case assuming the frequency distribution 121 output from the measuring unit 120. The calculating unit 130 correlates and outputs the total efficiency calculated for multiple candidate values with the multiple candidate values, to the controller 140.

The controller 140 controls the predetermined parameter of the amplifying unit 110, based on the total efficiency calculated for the multiple candidate values of the predetermined parameter and output from the calculating unit 130. For example, the controller 140 selects from among the multiple candidate values of the predetermined parameter, a candidate value that causes the total efficiency output from the calculating unit 130 to satisfy a predetermined condition. For example, the controller 140 selects a candidate value that causes the highest total efficiency. Alternatively, the controller 140 may select a candidate value causing a total efficiency that is closest to a predetermined target value.

The controller 140 provides control such that the predetermined parameter of the amplifying unit 110 becomes the selected candidate value. For example, if the predetermined parameter is the intermediate efficiency peak point, the total efficiency calculated for each candidate value of the intermediate efficiency peak point is output from the calculating unit 130 to the controller 140. In response, the controller 140 selects from among the candidate values output from the calculating unit 130, the candidate value causing the highest total efficiency. The controller 140 then adjusts the voltage supplied to at least one of the amplifiers 111 and 112 such that the intermediate efficiency peak point of the amplifying unit 110 becomes the selected candidate value.

According to the amplifying apparatus 100 depicted in FIG. 1, a predetermined parameter of the amplifying unit 110 can be controlled so as to increase the total efficiency of amplification in the frequency distribution 121 of instantaneous power of the signal to be amplified within a predetermined period. As a result, the efficiency of amplification by the amplifying unit 110 can accurately be controlled.

Although the case of the measuring unit 120 measuring frequency distribution of instantaneous power is described, the measuring unit 120 may measure frequency distribution of instantaneous voltage of the signal input to the amplifying unit 110 within a predetermined period. For example, the measuring unit 120 repeatedly detects the instantaneous voltage of the signal input to the amplifying unit 110 and tabulates the detection result of the instantaneous voltage within the predetermined period to measure the frequency distribution of the instantaneous voltage. For example, the frequency distribution of the instantaneous voltage is information indicative of frequency (e.g., the number of times) of detection within the predetermined period for each value of the instantaneous voltage. The measuring unit 120 outputs the measured frequency distribution of the instantaneous voltage to the controller 140.

Figure 2:
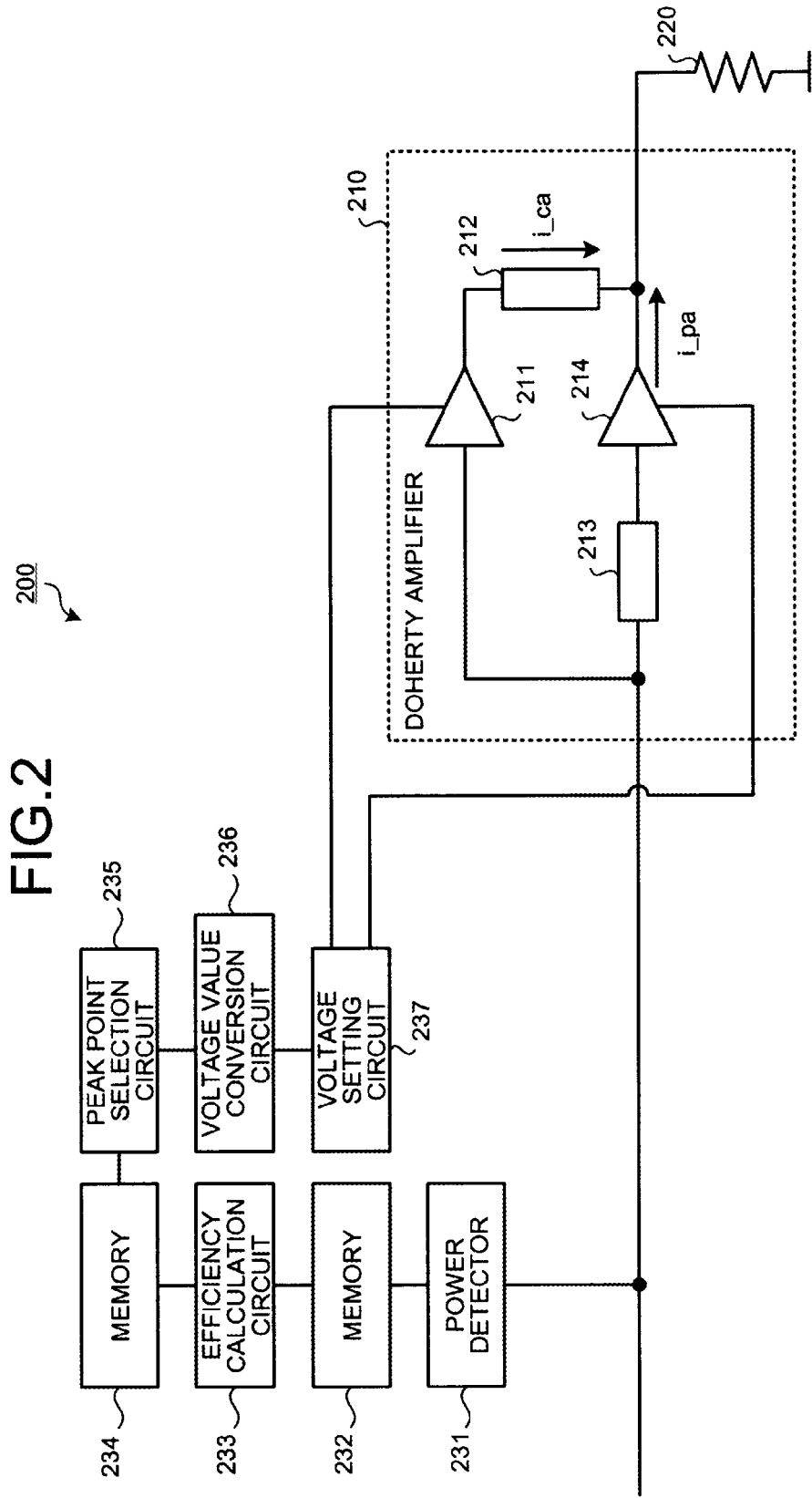
FIG. 2 is a diagram of an example of a configuration of the amplifying apparatus.

FIG. 2 is a diagram of an example of a configuration of the amplifying apparatus. An amplifying apparatus 200 depicted in FIG. 2 is an example of the amplifying apparatus 100 depicted in FIG. 1. The amplifying apparatus 200 includes a Doherty amplifier 210, an output load 220, a power detector 231, a memory 232, an efficiency calculation circuit 233, a memory 234, a peak point selection circuit 235, a voltage value conversion circuit 236, and a voltage setting circuit 237.

The amplifying unit 110 depicted in FIG. 1 can be implemented by the Doherty amplifier 210, for example. The measuring unit 120 depicted in FIG. 1 can be implemented by the power detector 231, the memory 232, and the efficiency calculation circuit 233, for example. The calculating unit 130 depicted in FIG. 1 can be implemented by the efficiency calculation circuit 233 and the memory 234, for example. The controller 140 depicted in FIG. 1 can be implemented by the peak point selection circuit 235, the voltage value conversion circuit 236, and the voltage setting circuit 237, for example.

The efficiency calculation circuit 233, the peak point selection circuit 235, and the voltage value conversion circuit 236 can be implemented by digital circuits such as a field programmable array (FPGA) and a central processing unit (CPU), for example. A signal to be amplified by the amplifying apparatus 200 is, for example, a modulated radio frequency (RF) signal and is input to the Doherty amplifier 210 and the power detector 231.

The Doherty amplifier 210 includes a carrier amplifier 211, ¼ wavelength lines 212 and 213, and a peak amplifier 214. Each of the carrier amplifier 211 and the peak amplifier 214 is a semiconductor amplifier such as a field effect transistor (FET) and a bipolar transistor (BPT).

If the carrier amplifier 211 and the peak amplifier 214 are FETs, the drain voltages of the carrier amplifier 211 and the peak amplifier 214 are supplied from the voltage setting circuit 237. If the carrier amplifier 211 and the peak amplifier 214 are BPTs, the collector voltages of the carrier amplifier 211 and the peak amplifier 214 are supplied from the voltage setting circuit 237. The case of the carrier amplifier 211 and the peak amplifier 214 implemented by FETs will hereinafter be described primarily.

A signal input to the Doherty amplifier 210 is input to the carrier amplifier 211 and the ¼ wavelength line 213. The carrier amplifier 211 (first amplifier) amplifies the input signal by using the drain voltage supplied from the voltage setting circuit 237. The carrier amplifier 211 outputs the amplified signal to the ¼ wavelength line 212.

Each of the ¼ wavelength lines 212 and 213 (first and second transmission lines) is a transmission line having a length that is ¼ the center wavelength of the signal to be amplified by the amplifying apparatus 200. The ¼ wavelength line 212 is coupled in series downstream from the carrier amplifier 211. The ¼ wavelength line 212 transmits and outputs the signal output from the carrier amplifier 211. The ¼ wavelength line 213 is coupled in series upstream to the peak amplifier 214. The ¼ wavelength line 213 transmits and outputs to the peak amplifier 214, the signal input to the ¼ wavelength line 213.

The peak amplifier 214 (second amplifier) amplifies the signal output from the ¼ wavelength line 213 by using the drain voltage supplied from the voltage setting circuit 237. The peak amplifier 214 outputs the amplified signal. It is assumed that a current of the signal output from the ¼ wavelength line 212 is i_ca. It is also assumed that a current of the signal output from the peak amplifier 214 is i_pa. The signals output from the ¼ wavelength line 212 and the peak amplifier 214 are combined and output to the output load 220.

The power detector 231 repeatedly detects instantaneous power of the signal input thereto. The power detector 231 writes an instantaneous power sequence correlating the detected instantaneous power with the detected time into the memory 232 (see, e.g., FIG. 3).

The efficiency calculation circuit 233 reads the instantaneous power sequence stored in the memory 232, at predetermined intervals (see, e.g., FIG. 4), for example. The efficiency calculation circuit 233 calculates instantaneous power distribution based on the read instantaneous power sequence. The instantaneous power distribution is information corresponding to the frequency distribution 121 depicted in FIG. 1, for example.

The efficiency calculation circuit 233 calculates the total efficiency of the Doherty amplifier 210 for multiple candidate values of the intermediate efficiency peak point of the Doherty amplifier 210 based on the calculated instantaneous power distribution. For example, it is assumed that f(v) is a frequency causing an output voltage of v in the Doherty amplifier 210, based on the instantaneous power distribution (see, e.g., FIG. 5).

It is also assumed that ηd (v, α) is instantaneous efficiency of amplification for the output voltage v when the intermediate efficiency peak point of the Doherty amplifier 210 is α. The ηd(v, α) is information corresponding to the efficiency characteristic information described above and is stored in the memory of the amplifying apparatus 200, for example. Total efficiency ηt(α) of amplification by the Doherty amplifier 210 in the case of the intermediate efficiency peak point of α in the instantaneous power distribution can be expressed by, for example, Equation (1).

$$\eta t(\alpha) = \frac{\int_0^1 f(v) \cdot v^2 \cdot \delta v}{\int_0^1 f(v) \cdot \frac{v^2}{\eta d(v, \alpha)} \cdot \delta v} \quad (1)$$

The denominator on the right side of Equation (1) indicates the input power of the Doherty amplifier 210, for example. The numerator on the right side of Equation (1) indicates the output power of the Doherty amplifier 210, for example. The efficiency calculation circuit 233 calculates the total efficiency ηt(α) from Equation (1), for the multiple candidate values of the intermediate efficiency peak point α. The efficiency calculation circuit 233 writes correlation information correlating the calculated total efficiency ηt(α) with the candidate values of the intermediate efficiency peak point α into the memory 234 (see, e.g., FIG. 7).

After calculating the total efficiency ηt(α) of the Doherty amplifier 210, the efficiency calculation circuit 233 may delete among the instantaneous power sequences stored in the memory 232, an instantaneous power sequence not used in subsequent calculations of the total efficiency ηt(α).

The peak point selection circuit 235 searches the memory 234 to select the intermediate efficiency peak point a correlated with the highest total efficiency ηt(α). The peak point selection circuit 235 outputs the selected intermediate efficiency peak point α to the voltage value conversion circuit 236.

The voltage value conversion circuit 236 converts the intermediate efficiency peak point α output from the peak point selection circuit 235 into a voltage value of the carrier amplifier 211. The voltage value conversion circuit 236 outputs the converted voltage value to the voltage setting circuit 237. For example, the voltage value conversion circuit 236 derives the voltage value of the carrier amplifier 211 at which the intermediate efficiency peak point α of the Doherty amplifier 210 becomes the intermediate efficiency peak point α output from the peak point selection circuit 235.

Description will be made of a case where the normalization is performed such that a total current of 1 is generated from the current i_ca of the signal from the carrier amplifier 211 and output from the ¼ wavelength line 212 and the current i_pa of the signal from the peak amplifier 214 when the output power of the Doherty amplifier 210 is maximized. In this case, the current i_ca of the signal from the carrier amplifier 211 output from the ¼ wavelength line 212 is α and the current i_pa of the signal from the peak amplifier 214 is 1-α.

It is assumed that the voltage supplied from the voltage setting circuit 237 to the peak amplifier 214 is v_pa. It is assumed that the voltage supplied from the voltage setting circuit 237 to the carrier amplifier 211 is v_ca. In this case, for example, v_pa:v_ca=1-α:α is satisfied. Therefore, the voltage v_ca supplied to the carrier amplifier 211 can be expressed by, for example, Equation (2).

$$v\_ca = \frac{\alpha}{1-\alpha} \cdot v\_pa \quad (2)$$

For example, the voltage value conversion circuit 236 derives the voltages v_ca and v_pa satisfying Equation (2) based on the intermediate efficiency peak point α output from the peak point selection circuit 235. The voltage value conversion circuit 236 outputs the derived voltages v_ca and v_pa to the voltage setting circuit 237.

The voltage setting circuit 237 sets the voltage v_ca output from the voltage value conversion circuit 236 as the supply voltage (e.g., drain voltage) to the carrier amplifier 211. The voltage setting circuit 237 sets the voltage v_pa output from the voltage value conversion circuit 236 as the supply voltage (e.g., drain voltage) to the peak amplifier 214.

FIG. 3 is a diagram of an example of an instantaneous power sequence. An instantaneous power sequence 300 depicted in FIG. 3 is an example of an instantaneous power sequence stored in the memory 232 depicted in FIG. 2. In the instantaneous power sequence 300, instantaneous powers P1, P2, P3, . . . , Pn measured by the power detector 231 are correlated with respective times t1, t2, t3, . . . , tn. The efficiency calculation circuit 233 reads instantaneous powers of a predetermined measurement section from the instantaneous power sequence 300.

For example, if the predetermined measurement section is from time t1 to time t3, the efficiency calculation circuit 233 reads the instantaneous powers P1 to P3 corresponding to the times t1 to t3 from the memory 232. The efficiency calculation circuit 233 derives the instantaneous power distribution in the read instantaneous powers P1 to P3. For example, in the case of P1=P2=p2≠P3=p2, the efficiency calculation circuit 233 derives the instantaneous power distribution indicative of two times for instantaneous power p1 and one time for instantaneous power p2.

FIG. 4 is a diagram of an example of a measurement section. In FIG. 4, the horizontal axis indicates time. A signal section 411 indicates a period while a mode of the signals to be amplified is a transmission mode A. A signal section 412 indicates a period while a mode of the signals to be amplified is a transmission mode B different from the transmission mode A. Therefore, FIG. 4 depicts a situation when the mode of the signals to be amplified is switched from the transmission mode A to the transmission mode B.

Measurement sections 421 to 429 indicate a unit (predetermined measurement period) of reading the instantaneous power from the instantaneous power sequence by the efficiency calculation circuit 233. Each of the measurement sections 421 to 429 is a period corresponding to the predetermined period described above. The efficiency calculation circuit 233 derives the instantaneous power distribution for each of the measurement sections 421 to 429 and calculates the total efficiency of the Doherty amplifier 210 for each intermediate efficiency peak point α in the derived instantaneous power distribution.

As depicted in FIG. 4, the measurement sections 421 to 429 are cyclic periods and include successive periods that overlap. As a result, the frequency of measurement can be increased while the time of each measurement section is increased. By increasing the time of each measurement section, more instantaneous powers can be detected in each section and the instantaneous power distribution of the signals to be amplified can be measured more accurately.

By increasing the frequency of the measurement, the cycles of calculation of the total efficiency and control of the Doherty amplifier 210 can be shortened and for example, a quicker control response of the Doherty amplifier 210 can be made to a mode change of the signals to be amplified. Therefore, for example, the efficiency of amplification of the Doherty amplifier 210 can accurately be controlled when the mode of the signals to be amplified is changed.

FIG. 5 is a diagram of an example of instantaneous power distribution. In FIG. 5, the instantaneous power distribution of the signals amplified by the Doherty amplifier 210 is indicated as distribution of output voltages from the Doherty amplifier 210. The horizontal axis of FIG. 5 indicates the output voltage v [V] of the Doherty amplifier 210. The vertical axis of FIG. 5 indicates the frequency of occurrence of the output voltage.

Instantaneous power distribution 500 indicates the distribution of output voltages in the Doherty amplifier 210. A frequency causing the output voltage of v in the Doherty amplifier 210 indicated by the instantaneous power distribution 500 is f(v) of Equation (1).

FIG. 6 is a diagram of an example of instantaneous efficiency characteristics of the Doherty amplifier. The horizontal axis of FIG. 6 indicates the output voltage v [V] of the Doherty amplifier 210. However, the output voltage v of the horizontal axis is normalized by setting the maximum value to 1. Instantaneous efficiency characteristics 600 indicate the characteristics of the instantaneous efficiency of amplification for the output voltage v of the Doherty amplifier 210.

The instantaneous efficiency characteristics 600 have the peak points of the instantaneous efficiency at 1 [V] that is the maximum value of the output voltage v and an intermediate voltage α (0<α<1). When the intermediate efficiency peak point of the Doherty amplifier 210 is α, instantaneous efficiency of amplification for the output voltage v indicated by the instantaneous efficiency characteristics 600 is ηd(v, α) of Equation (1).

FIG. 7 is a diagram of an example of a calculation result of total efficiency. A calculation result 700 depicted in FIG. 7 is a calculation result of the total efficiency for each intermediate efficiency peak point α stored in the memory 234 depicted in FIG. 2. As depicted in FIG. 7, in the calculation result 700, total efficiencies X1, X2, X3, . . . , Xm are respectively correlated with m candidate values α1, α2, α3, . . . , αm of the intermediate efficiency peak point α.

From the candidate values α1, α2, α3, . . . , αm, the peak point selection circuit 235 selects the intermediate efficiency peak point α correlated with the highest total efficiency among the total efficiencies X1, X2, X3, . . . , Xm. For example, if the total efficiency X3 is the highest among the total efficiencies X1, X2, X3, . . . , Xm, the peak point selection circuit 235 selects the candidate value α3 correlated with the total efficiency X3 as the value of the intermediate efficiency peak point α.

FIG. 8 is a diagram of an example of a signal processing apparatus to which the amplifying apparatus is applied. In FIG. 8, components identical to the components depicted in FIG. 2 are denoted by the same reference numerals used in FIG. 2 and will not be described. As depicted in FIG. 8, a signal processing apparatus 800 includes a DAC 811, a modulator 812, and the Doherty amplifier 210. However, in FIG. 8, the power detector 231 in the configuration of the Doherty amplifier 210 is depicted and the other constituent elements are not depicted.

To the digital/analog converter (DAC) 811, a baseband digital signal is input. The DAC 811 converts the input baseband digital signal into a baseband analog signal. The DAC 811 outputs the converted baseband analog signal to the modulator 812.

The modulator 812 performs high-frequency modulation based on the baseband analog signal output from the DAC 811. The modulator 812 outputs an RF signal acquired by the modulation to the Doherty amplifier 210. The Doherty amplifier 210 amplifies and outputs the RF signal output from the modulator 812. For example, the power detector 231 detects the instantaneous power of the RF signal output from the modulator 812.

The signal processing apparatus 800 depicted in FIG. 8 can convert the input baseband digital signal into an RF signal and can amplify and output the converted RF signal. The signal processing apparatus 800 is disposed in a radio transmission apparatus, for example. In this case, the signal output from the signal processing apparatus 800 is wirelessly transmitted through an antenna of the radio transmission apparatus, for example.

As described, the amplifying apparatus 200 according to the first embodiment can control the intermediate peak point of the Doherty amplifier 210 so as to maximize the total efficiency of amplification in the frequency distribution of the instantaneous power or instantaneous voltage of the signals to be amplified within a predetermined period. As a result, the efficiency of amplification of the Doherty amplifier 210 can be controlled accurately.

A second embodiment will be described in terms of components differing from the components of the first embodiment. In the amplifying apparatus 100 (see FIG. 1) according to the second embodiment, the predetermined parameter is a supply voltage to at least one of the amplifiers 111 and 112, for example.

In this case, the calculating unit 130 calculates total efficiency of amplification of the amplifying unit 110 in the frequency distribution 121 output from the measuring unit 120 for multiple candidate values of the supply voltage. The controller 140 controls the supply voltage to at least one of the amplifiers 111 and 112 based on the total efficiency output from the calculating unit 130 for multiple candidate values.

FIG. 9 is a diagram of an example of a configuration of the amplifying apparatus according to the second embodiment. In FIG. 9, components identical to the components depicted in FIG. 2 are denoted by the same reference numerals used in FIG. 2 and will not be described. As depicted in FIG. 9, the amplifying apparatus 200 according to the second embodiment includes a memory 901 and a voltage selection circuit 902 instead of the peak point selection circuit 235 and the voltage value conversion circuit 236 depicted in FIG. 2.

The memory 901 stores correlation information between a combination of the voltages v_ca and v_pa supplied to the carrier amplifier 211 and the peak amplifier 214 and the instantaneous efficiency of amplification of the Doherty amplifier 210, for each instantaneous voltage (see, e.g., FIG. 10).

The efficiency calculation circuit 233 calculates the total efficiency of amplification by the Doherty amplifier 210, for each combination of the voltages v_ca and v_pa supplied to the carrier amplifier 211 and the peak amplifier 214 in the calculated instantaneous power distribution. For example, the total efficiency of amplification by the Doherty amplifier 210 can be obtained from the instantaneous power, and the direct-current voltages and direct electric currents supplied to the carrier amplifier 211 and the peak amplifier 214.

For example, the function f(v) of occurrence frequency for the output voltage v of the Doherty amplifier 210 indicated by the instantaneous power distribution 500 of FIG. 5 is converted into a function f(p) of occurrence frequency for electrical power p. The instantaneous efficiency ηd(v, α) for the output voltage v indicated in the instantaneous efficiency characteristics 600 of FIG. 6 is converted into total efficiency ηd(p, v_ca, v_pa) for the electrical power p and the voltages v_ca and v_pa supplied to the carrier amplifier 211 and the peak amplifier 214.

The ηd (p, v_ca, v_pa) is information corresponding to the efficiency characteristic information described above and is stored in, for example, the memory of the amplifying apparatus 200 (see, e.g., FIG. 10). Total efficiency ηt(v_ca, v_pa) of amplification of the Doherty amplifier 210 for the voltages v_ca and v_pa can be expressed by, for example, Equation (3).

$$\eta t(\text{v\_ca, v\_pa}) = \frac{\int_0^1 f(p) \cdot p \cdot \delta p}{\int_0^1 f(p) \cdot \frac{p}{\eta d(p, \text{v\_ca, v\_pa})} \cdot \delta p} \quad (3)$$

The denominator on the right side of Equation (3) indicates the input power of the Doherty amplifier 210, for example. The numerator on the right side of Equation (3) indicates the output power of the Doherty amplifier 210, for example. The efficiency calculation circuit 233 calculates the total efficiency ηt(v_ca, v_pa) from Equation (3) for the combinations of the voltages v_ca and v_pa. The efficiency calculation circuit 233 writes correlation information correlating the calculated total efficiency ηt(v_ca, v_pa) with the combinations of the voltages v_ca and v_pa into the memory 234 (see, e.g., FIG. 11).

After calculating the total efficiency ηt(v_ca, v_pa) of the Doherty amplifier 210, the efficiency calculation circuit 233 may delete among the instantaneous power sequences stored in the memory 232, an instantaneous power sequence not used in subsequent calculations of the total efficiency ηt(v_ca, v_pa).

FIG. 10 is a diagram of an example of instantaneous efficiency characteristics for each instantaneous power of the Doherty amplifier. Correlation information 1000 depicted in FIG. 10 is correlation information stored in the memory 901 depicted in FIG. 9. In the correlation information 1000, correlation information correlating instantaneous efficiency η(v_ca, v_pa) with each combination of the voltages v_ca and v_pa supplied to the carrier amplifier 211 and the peak amplifier 214 is stored for each of the instantaneous powers P1, P2, . . . .

In the correlation information 1000, the currents I_ca and I_pa supplied to the carrier amplifier 211 and the peak amplifier 214 are also correlated with the voltages v_ca and v_pa supplied to the carrier amplifier 211 and the peak amplifier 214.

FIG. 11 is a diagram of an example of a calculation result of total efficiency. A calculation result 1100 depicted in FIG. 11 is a calculation result of the total efficiency for each combination of the voltages v_ca and v_pa supplied to the carrier amplifier 211 and the peak amplifier 214, stored in the memory 234 depicted in FIG. 9. In the calculation result 1100, total efficiencies X1, X2, X3, . . . , Xm are respectively correlated with the combinations of the voltage v_ca of the carrier amplifier 211 and the voltage v_pa of the peak amplifier 214.

From the combinations of the voltage v_ca of the carrier amplifier 211 and the voltage v_pa of the peak amplifier 214, the voltage selection circuit 902 selects the combination correlated with the highest total efficiency among the total efficiencies X1, X2, X3, . . . , Xm. For example, if the total efficiency X3 is the highest among the total efficiencies X1, X2, X3, . . . , Xm, the voltage selection circuit 902 selects voltages v_3ca and v_3pa correlated with the total efficiency X3 as the voltages v_ca and v_pa.

Figure 12:
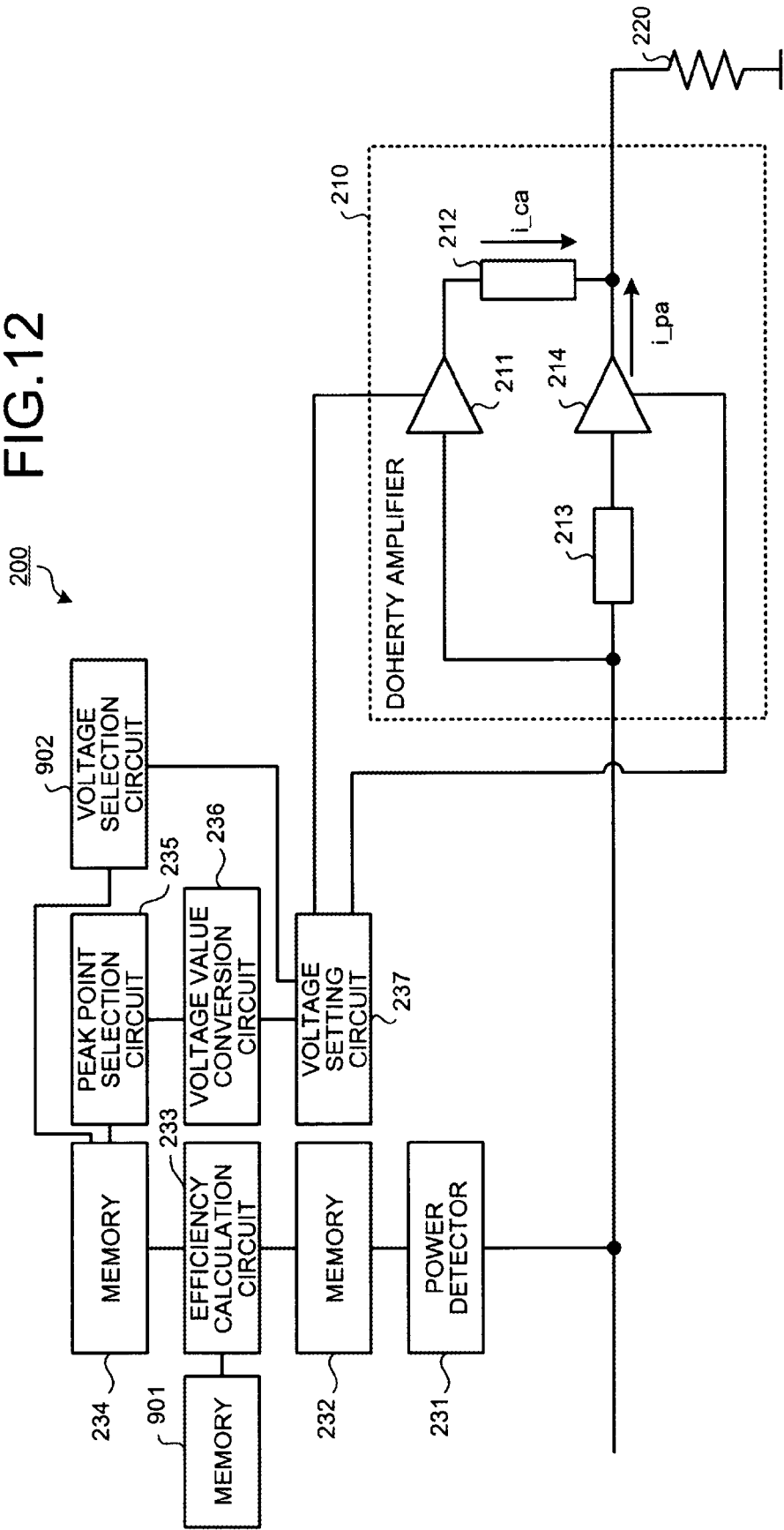
FIG. 12 is a diagram of a modification of the amplifying apparatus according to the second embodiment.

FIG. 12 is a diagram of a modification of the amplifying apparatus according to the second embodiment. In FIG. 12, components identical to the components depicted in FIG. 2 or 9 are denoted by the same reference numerals used in FIGS. 2 and 9, and will not be described. As depicted in FIG. 12, the amplifying apparatus 200 may include the peak point selection circuit 235 and the voltage value conversion circuit 236 depicted in FIG. 2 in addition to the configuration depicted in FIG. 9.

The amplifying apparatus 200 depicted in FIG. 12 is a configuration combining the amplifying apparatus 200 depicted in FIG. 2 and the amplifying apparatus 200 depicted in FIG. 9. In the amplifying apparatus 200 depicted in FIG. 12, the predetermined parameters of the Doherty amplifier 210 to be controlled include the intermediate efficiency peak point α, and the voltages v_ca and v_pa supplied to the carrier amplifier 211 and the peak amplifier 214.

The efficiency calculation circuit 233 writes both the calculation result of total efficiency for each intermediate efficiency peak point α and the calculation result of total efficiency for each combination of the voltages of the carrier amplifier 211 and the peak amplifier 214 into the memory 234.

The peak point selection circuit 235 selects and outputs to the voltage value conversion circuit 236, the intermediate efficiency peak point α correlated with the highest total efficiency based on the calculation result of total efficiency of each intermediate efficiency peak point α stored in the memory 234. The peak point selection circuit 235 may notify the voltage setting circuit 237 of the total efficiency corresponding to the selected intermediate efficiency peak point α.

The voltage selection circuit 902 selects and outputs to the voltage setting circuit 237, the combination correlated with the highest total efficiency based on the total efficiency of each combination of the voltages of the carrier amplifier 211 and the peak amplifier 214 stored in the memory 234. The voltage selection circuit 902 may notify the voltage setting circuit 237 of the total efficiency corresponding to the selected combination.

The voltage setting circuit 237 sets a combination of the voltages output from one among the voltage value conversion circuit 236 and the voltage selection circuit 902, to the carrier amplifier 211 and the peak amplifier 214. For example, the voltage setting circuit 237 sets a combination of the voltages output from one among the voltage value conversion circuit 236 and the voltage selection circuit 902 making a notification of higher efficiency, to the carrier amplifier 211 and the peak amplifier 214.

As described, the amplifying apparatuses 100, 200 according to the second embodiment can control the supply voltages of the Doherty amplifier 210 so as to maximize the total efficiency of amplification in the frequency distribution of the instantaneous power or instantaneous voltage of the signals to be amplified within a predetermined period. As a result, the efficiency of amplification of the Doherty amplifier 210 can accurately be controlled.

Figure 13:
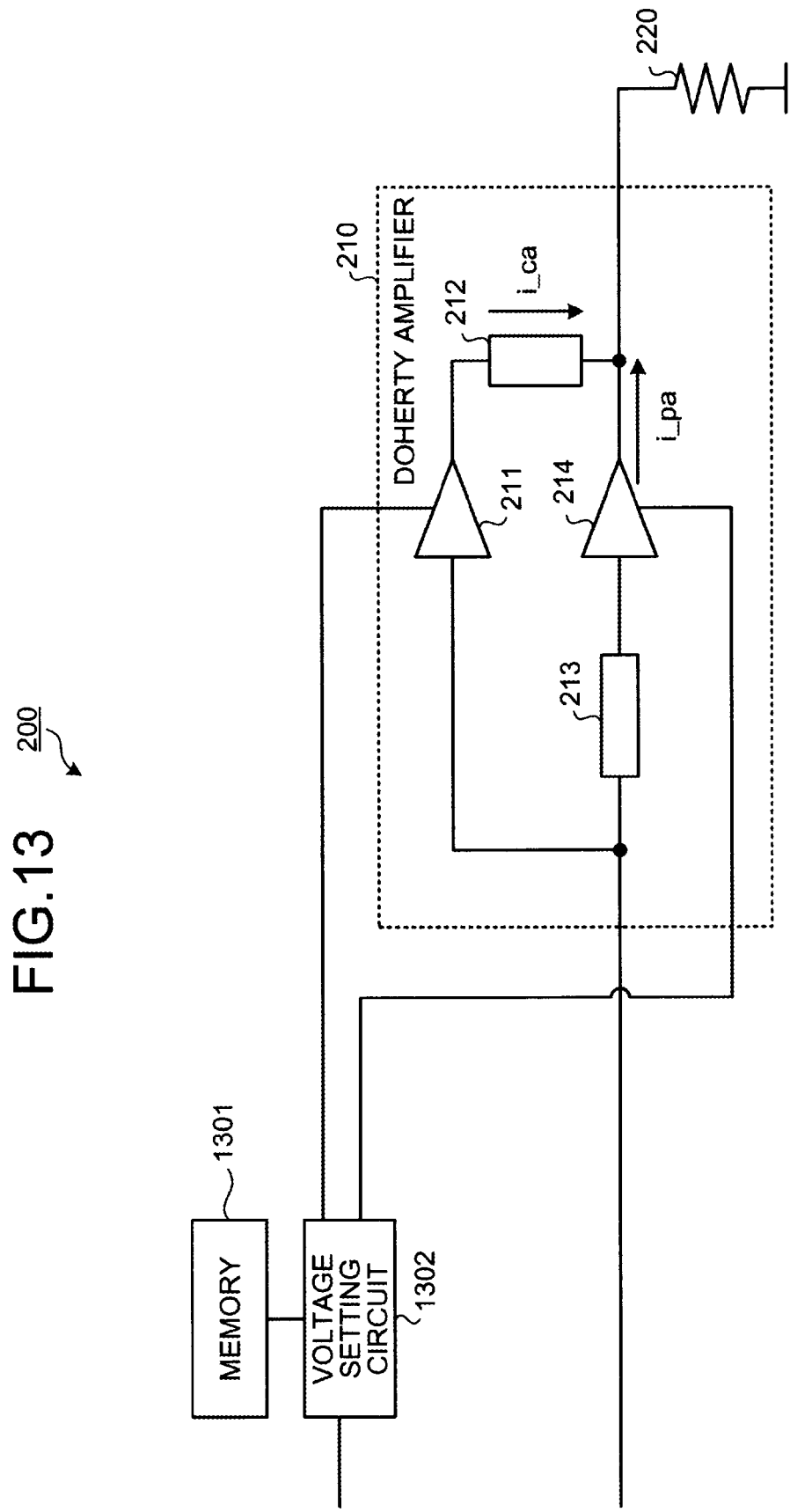
FIG. 13 is a diagram of an example of a configuration of the amplifying apparatus according to a third embodiment.

FIG. 13 is a diagram of an example of a configuration of the amplifying apparatus according to the third embodiment. In FIG. 13, components identical to the components depicted in FIG. 2 are denoted by the same reference numerals used in FIG. 2 and will not be described. As depicted in FIG. 13, the amplifying apparatus 200 according to the third embodiment includes the Doherty amplifier 210, the output load 220, a memory 1301, and a voltage setting circuit 1302.

The memory 1301 stores correlation information correlating an instantaneous power distribution number with a combination of the voltages v_ca and v_pa supplied to the carrier amplifier 211 and the peak amplifier 214. The instantaneous power distribution number is a number that varies according to the modulation mode, a multiplex mode, a transmission parameter, etc. of the signal input to the amplifying apparatus 200 (see, e.g., FIG. 14).

To the voltage setting circuit 1302, the instantaneous power distribution number is input from a higher protocol of a communication apparatus including the amplifying apparatus 200, for example. The voltage setting circuit 1302 reads from the memory 1301, the combination of the voltages v_ca and v_pa supplied to the carrier amplifier 211 and the peak amplifier 214 corresponding to the input instantaneous power distribution number. The voltage setting circuit 1302 sets the read voltage v_ca as the supply voltage to the carrier amplifier 211. The voltage setting circuit 1302 sets the read voltage v_pa as the supply voltage to the peak amplifier 214.

FIG. 14 is a diagram of an example of a relationship between signal properties and the instantaneous power distribution number. Relationship information 1400 depicted in FIG. 14 is an example of relationships between the modes and transmission signal information of the signals to be amplified and the instantaneous power distribution number stored in the memory 1301 depicted in FIG. 13. As depicted in the relationship information 1400, the instantaneous power distribution number is correlated with each combination of the multiplex mode, the modulation mode, the transmission signal information, and the measurement section of the signals to be amplified in the relationship information 1400.

FIG. 15 is a diagram of an example of correlation information between the instantaneous power distribution number and a combination of the voltages. Correlation information 1500 depicted in FIG. 15 is an example of correlation information correlating the instantaneous power distribution number with the combination of the voltages v_ca and v_pa supplied to the carrier amplifier 211 and the peak amplifier 214 stored in the memory 1301 depicted in FIG. 13.

For example, a designer derives the instantaneous power distribution of signals to be amplified while changing the combination of the multiplex mode, the modulation mode, the transmission signal information, and the measurement section of the signals to be amplified. The designer calculates the combination of the voltages v_ca and v_pa supplied to the carrier amplifier 211 and the peak amplifier 214, maximizing the total efficiency of the Doherty amplifier 210 in the derived instantaneous power distribution.

The designer then correlates and stores the calculated combination with the instantaneous power distribution number into the voltage setting circuit 1302 as the correlation information 1500. At this point, the combinations of the voltages v_ca and v_pa for the same or similar instantaneous power distributions are correlated with the same instantaneous power distribution number. As a result, the instantaneous power distribution number can be information that varies according to the instantaneous power distribution.

As described, the amplifying apparatus 200 according to the third embodiment preliminarily stores the correlation information 1500 between the instantaneous power distribution number indicative of instantaneous power distribution of signals and the combination of the voltages v_ca and v_pa maximizing the total efficiency of the Doherty amplifier 210. The instantaneous power distribution number indicative of the instantaneous power distribution of input signals is acquired and the voltages v_ca and v_pa corresponding to the acquired instantaneous power distribution number are selected and set to the Doherty amplifier 210. Therefore, the supply voltage of the Doherty amplifier 210 can be controlled so as to maximize the total efficiency of amplification without measuring the instantaneous power distribution of the input signals. As a result, the efficiency of amplification of the Doherty amplifier 210 can accurately be controlled.

Modifications of the embodiments described above will hereinafter be described.

FIG. 16A is a diagram of a first modification of the signal processing apparatus. In FIG. 16A, components identical to the components depicted in FIG. 8 are denoted by the same reference numerals used in FIG. 8 and will not be described. As depicted in FIG. 16A, the power detector 231 may detect electrical power based on a baseband analog signal output from the DAC 811 to the modulator 812.

FIG. 16B is a diagram of a second modification of the signal processing apparatus. In FIG. 16B, components identical to the components depicted in FIG. 8 are denoted by the same reference numerals used in FIG. 8 and will not be described. As depicted in FIG. 16B, the power detector 231 may detect electrical power based on a baseband analog signal input to the DAC 811.

FIG. 16C is a diagram of a third modification of the signal processing apparatus. In FIG. 16C, components identical to the components depicted in FIG. 8 are denoted by the same reference numerals used in FIG. 8 and will not be described. As depicted in FIG. 16C, the signal processing apparatus 800 may include an IF convertor 1631 in addition to the configuration depicted in FIG. 8. The IF convertor 1631 converts a baseband digital signal input to the signal processing apparatus 800 into an IF digital signal in the intermediate frequency (IF) band. The IF convertor 1631 outputs the converted IF digital signal to the DAC 811.

The DAC 811 converts the IF digital signal output from the IF convertor 1631 into an IF analog signal. The DAC 811 outputs the converted IF analog signal to the modulator 812. The modulator 812 performs high-frequency modulation based on the IF analog signal output from the DAC 811. The power detector 231 detects electrical power based on the IF analog signal output from the DAC 811 to the modulator 812, for example.

FIG. 16D is a diagram of a fourth modification of the signal processing apparatus. In FIG. 16D, components identical to the components depicted in FIG. 16C are denoted by the same reference numerals used in FIG. 16C and will not be described. As depicted in FIG. 16D, the power detector 231 may detect electrical power based on the IF digital signal output from the IF convertor 1631 to the DAC 811.

The modifications depicted in FIGS. 16A to 16D are applicable to the embodiments described above, for example. As depicted in FIGS. 16A to 16D, the instantaneous power sequence may be acquired from the baseband analog signal, the baseband digital signal, the IF analog signal, or the IF digital signal.

Figure 17A:
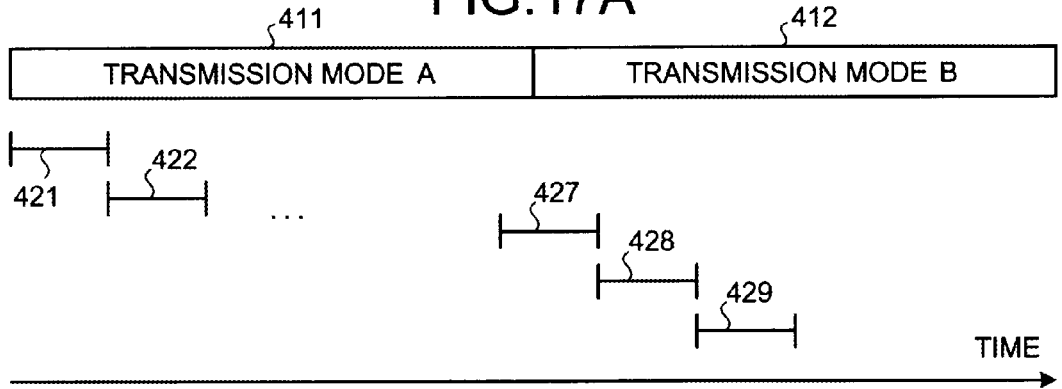
FIG. 17A is a diagram of a first modification of the measurement section.

FIG. 17A is a diagram of a first modification of the measurement section. In FIG. 17A, components identical to the components depicted in FIG. 4 are denoted by the same reference numerals used in FIG. 4 and will not be described. As depicted in FIG. 17A, the measurement sections 421 to 429 may be successive measurement sections without overlapping with each other. As a result, the amount of processing can be reduced as compared to the control of the Doherty amplifier 210 using the measurement sections depicted in FIG. 4, for example.

Figure 17B:
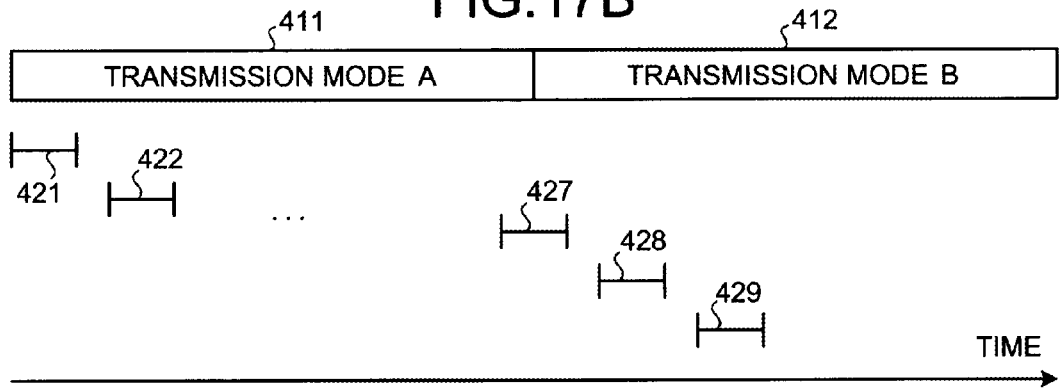
FIG. 17B is a diagram of a second modification of the measurement section.

FIG. 17B is a diagram of a second modification of the measurement section. In FIG. 17B, components identical to the components depicted in FIG. 4 are denoted by the same reference numerals used in FIG. 4 and will not be described. As depicted in FIG. 17B, the measurement sections 421 to 429 are cyclic measurement sections and may be measurement sections arranged at given intervals from each other. Such intermittent measurement of the instantaneous power distribution can reduce the amount of processing as compared to the control of the Doherty amplifier 210 using the measurement sections depicted in FIG. 17A, for example.

Figure 17C:
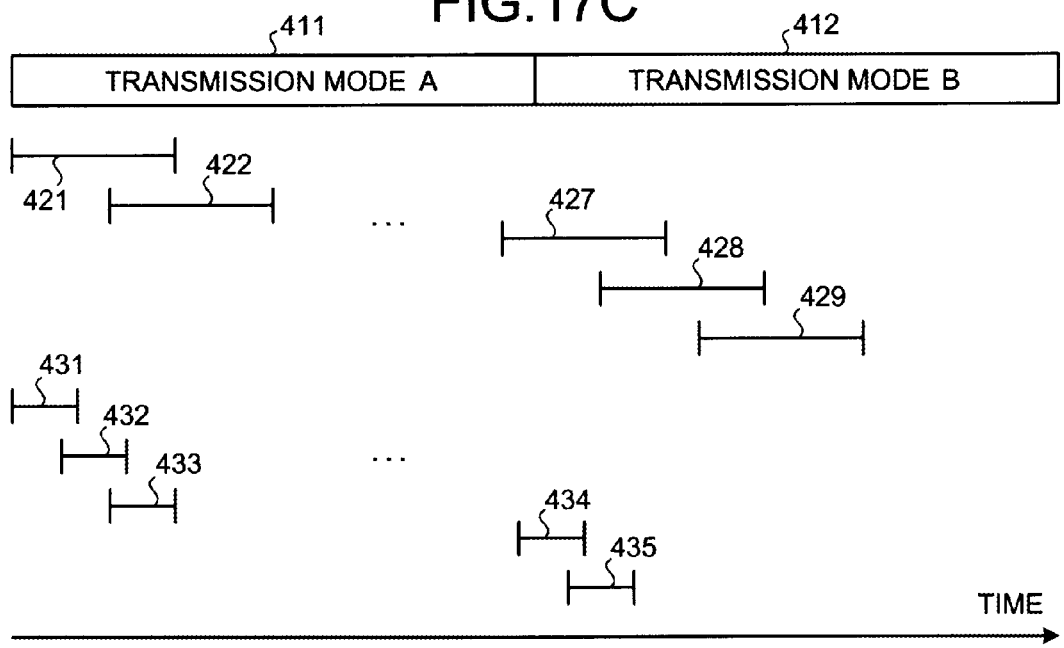
FIG. 17C is a diagram of a third modification of the measurement section.

FIG. 17C is a diagram of a third modification of the measurement section. In FIG. 17C, components identical to the components depicted in FIG. 4 are denoted by the same reference numerals used in FIG. 4 and will not be described. As depicted in FIG. 17C, the measurement sections 421 to 429 are cyclic measurement sections and are measurement sections having a temporal overlap between successive sections. Measurement sections 431 to 435 (second periods) temporally overlapping the measurement sections 421 to 429 may further be set separately from the measurement sections 421 to 429 (first periods).

The measurement sections 431 to 435 are measurement sections shorter than the measurement sections 421 to 429. Each period of the measurement sections 431 to 435 is shorter than each period of the measurement sections 421 to 429. The amplifying apparatus 200 switches and provides the control of the Doherty amplifier 210 based on the instantaneous power distribution of the measurement sections 421 to 429 and the control of the Doherty amplifier 210 based on the instantaneous power distribution of the measurement sections 431 to 435.

For example, the amplifying apparatus 200 first sets the parameters of the Doherty amplifier 210 based on the instantaneous power distribution of the measurement section 421. As a result, the parameters can be set based on more precise instantaneous power distribution as compared to setting the parameters based on the instantaneous power distribution of the measurement section 431 shorter than the measurement section 421, for example. Therefore, the efficiency of amplification of the Doherty amplifier 210 can accurately be controlled.

The amplifying apparatus 200 measures the instantaneous power distribution not only in the measurement sections 421 to 429 but also in the measurement sections 431 to 435. Therefore, when the transmission mode is switched to the transmission mode B, the amplifying apparatus 200 can quickly detect the change in mode, etc. of the signal, based on the instantaneous power distribution of the measurement sections 431 to 435. For example, if the mode of a signal is detected based on the instantaneous power distribution of the measurement section 434, the amplifying apparatus 200 sets the parameters of the Doherty amplifier 210 based on the instantaneous power distribution of the measurement section 434.

As a result, the effect of instantaneous power before the change in mode, etc. of the signal can be reduced as compared to setting the parameters of the Doherty amplifier 210 based on the measurement section 427 longer than the measurement section 434, for example. Therefore, the efficiency of amplification of the Doherty amplifier 210 can accurately be controlled according to the property after the change in mode, etc. of the signal.

After setting the parameters of the Doherty amplifier 210 based on the instantaneous power distribution of the measurement section 434, the amplifying apparatus 200 sets the parameters based on the instantaneous power distribution of the measurement section 428, which is subsequent to the measurement section 434 in the measurement sections 421 to 429. As a result, the effect of instantaneous power before the change in mode, etc. of the signal can be eliminated. The parameters of the Doherty amplifier 210 can be set based on more precise instantaneous power distribution as compared to setting the parameters of the Doherty amplifier 210 based on the instantaneous power distribution of the measurement section 435 shorter than the measurement section 428, for example. Therefore, the efficiency of amplification of the Doherty amplifier 210 can accurately be controlled.

As described, the efficiency calculation circuit 233 calculates each of the total efficiency (first efficiency) of the Doherty amplifier 210 based on the instantaneous power distribution of the measurement sections 421 to 429 and the total efficiency (second efficiency) of the Doherty amplifier 210 based on the instantaneous power distribution of the measurement sections 431 to 435. The efficiency calculation circuit 233 switches and provides first control in which the parameters are controlled using the calculated first efficiency and second control in which the parameters are controlled using the calculated second efficiency.

Although the measurement sections 421 to 429 and the measurement sections 431 to 435 are measurement sections having a temporal overlap between successive sections in this description, temporal overlap between successive sections is not a limitation. For example, at least one of the measurement sections 421 to 429 and the measurement sections 431 to 435 may have no overlap or no interval between successive sections (see, e.g., FIG. 17A) or may have an interval between successive sections (see, e.g., FIG. 17B).

FIG. 18 is a flowchart of an example of operation for control using the measurement sections depicted in FIG. 17C. In FIG. 18, a measurement section A indicates the measurement sections 421 to 429 (relatively long measurement section) depicted in FIG. 17C. In FIG. 18, a measurement section B indicates the measurement sections 431 to 435 (relatively short measurement section) depicted in FIG. 17C. A measurement section A setting flag and a measurement section B setting flag are stored in memory of the amplifying apparatus 200 and can be accessed the efficiency calculation circuit 233, for example.

An example of operation by the efficiency calculation circuit 233 of the amplifying apparatus 200 depicted in FIG. 2 will be described. First, the efficiency calculation circuit 233 starts measurement of instantaneous power distribution in the measurement section A (e.g., the measurement section 421) (step S1801). The efficiency calculation circuit 233 also starts measurement of instantaneous power distribution in the measurement section B (e.g., the measurement section 431) (step S1802). The efficiency calculation circuit 233 determines whether the measurement of the instantaneous power distribution in the measurement section B (e.g., the measurement section 431) has been completed (step S1803).

At step S1803, if the measurement in the measurement section B had been completed (step S1803: YES), the efficiency calculation circuit 233 calculates the total efficiency of each intermediate efficiency peak point $\alpha$ based on a result of the completed measurement of the instantaneous power distribution in the measurement section B. The peak point selection circuit 235 determines whether the intermediate efficiency peak point $\alpha$ of the highest total efficiency calculated by the efficiency calculation circuit 233 has changed from the previous calculation result (step S1804), thereby enabling the detection of a change in the instantaneous power distribution of the signal due to a change in mode, etc. of the signal. The previous calculation result can be acquired from the memory 234.

At step S1804, if the intermediate efficiency peak point $\alpha$ of the highest total efficiency has not changed (step S1804: NO), it can be determined that the instantaneous power distribution of the signal has not changed. Therefore, the efficiency calculation circuit 233 returns to step S1802.

At step S1804, if the intermediate efficiency peak point $\alpha$ of the highest total efficiency has changed (step S1804: YES), it can be determined that the instantaneous power distribution of the signal has changed. Therefore, the efficiency calculation circuit 233 writes into the memory 234, the total efficiency of each intermediate efficiency peak point $\alpha$ calculated based on a result of the measurement of the instantaneous power distribution in the measurement section B completed at step S1803.

As a result, the intermediate efficiency peak point $\alpha$ is selected by the peak point selection circuit 235 and the voltages of the carrier amplifier 211 and the peak amplifier 214 are set by the voltage setting circuit 237 (step S1805). The peak point selection circuit 235 sets the measurement section B setting flag to ON (step S1806) and the operation returns to step S1802.

At step S1803, if the measurement in the measurement section B has not been completed (step S1803: NO), the efficiency calculation circuit 233 determines whether the measurement in the measurement section A has been completed (step S1807). If the measurement in the measurement section A has not been completed (step S1807: NO), the efficiency calculation circuit 233 returns to step S1803.

At step S1807, if the measurement in the measurement section A has been completed (step S1807: YES), the efficiency calculation circuit 233 determines whether the measurement section B setting flag is set to ON (step S1808). If the measurement section B setting flag is not set to ON (step S1808: NO), it can be determined that a change in the instantaneous power distribution is not detected based on the measurement result of the instantaneous power distribution in the measurement section B and it can be determined that the measurement section A is a period before the change in the instantaneous power distribution or a period after the change in the instantaneous power distribution. In this case, the efficiency calculation circuit 233 writes into the memory 234, the total efficiency of each intermediate efficiency peak point $\alpha$ calculated based on a result of the measurement of the instantaneous power distribution in the measurement section A completed at step S1807.

As a result, the intermediate efficiency peak point $\alpha$ is selected by the peak point selection circuit 235 and the voltages of the carrier amplifier 211 and the peak amplifier 214 are set by the voltage setting circuit 237 (step S1812), thereby enabling the control of the voltages based on the instantaneous power distribution in the measurement section A, which is longer than the measurement section B.

At step S1808, if the measurement section B setting flag is set to ON (step S1808: YES), it can be determined that a change in the instantaneous power distribution is detected based on the measurement result of the instantaneous power distribution in the measurement section B. In this case, the efficiency calculation circuit 233 determines whether the measurement section A setting flag is set to ON (step S1809).

At step S1809, if the measurement section A setting flag is not set to ON (step S1809: NO), it can be determined that although a change in the instantaneous power distribution is detected, a period before the change in the instantaneous power distribution is included in the measurement section A of the measurement completed at step S1807. Since the total efficiency based on the instantaneous power distribution in the measurement section A is not correct, the efficiency calculation circuit 233 discards the calculation result of the total efficiency of the measurement section A (step S1810). The efficiency calculation circuit 233 sets the measurement section A setting flag to ON (step S1811) and goes to step S1814.

At step S1809, if the measurement section A setting flag is set to ON (step S1809: YES), it can be determined that although a change in the instantaneous power distribution is detected, the measurement section A of the measurement completed at step S1807 is a period after the change in the instantaneous power distribution. In this case, the efficiency calculation circuit 233 writes into the memory 234, the total efficiency of each intermediate efficiency peak point α calculated based on a result of the measurement of the instantaneous power distribution in the measurement section A completed at step S1807.

The efficiency calculation circuit 233 sets (clears) the measurement section A setting flag and the measurement section B setting flag to OFF (step S1812). The intermediate efficiency peak point α is selected by the peak point selection circuit 235 and the voltages of the carrier amplifier 211 and the peak amplifier 214 are set by the voltage setting circuit 237 (step S1813), thereby enabling the control of the voltages based on the instantaneous power distribution in the measurement section A, which is longer than the measurement section B, after the change in the instantaneous power distribution.

The efficiency calculation circuit 233 starts the measurement of the measurement section A (step S1814) and returns to step S1803.

With the steps described, a change in the instantaneous power distribution of the signal can be detected quickly by using the relatively short measurement section B to quickly control the supply voltages to the amplifying apparatus 200 in response to a change in the instantaneous power distribution of a signal. When the change in the instantaneous power distribution is detected, the amplifying apparatus 200 provides control based on the measurement section B without providing control based on the measurement section A, which includes a period before the change in the instantaneous power distribution. As a result, the efficiency of amplification of the Doherty amplifier 210 can be controlled accurately according to properties of the signal after the change in the instantaneous power distribution.

Since the measurement section B is a shorter measurement section, it is conceivable that the intermediate efficiency peak point of the highest efficiency may change even if the mode, etc. of the signal to be amplified are not switched. In this regard, for example, at step S1804, it may be determined whether the intermediate efficiency peak point of the highest efficiency calculated by the calculation efficiency circuit 233 has changed by a predetermined amount or more. If the amount of change in the intermediate efficiency peak point of the highest efficiency is less than the predetermined amount, it may be determined that the intermediate efficiency peak point of the highest efficiency has not changed.

Although an example of the operation by the amplifying apparatus 200 depicted in FIG. 2 is described, control with the measurement sections depicted in FIG. 17C can be implemented by the same process in the amplifying apparatus 200 depicted in FIG. 9, for example.

The modifications of the measurement sections depicted in FIGS. 17A to 17C and 18 are applicable to the first and second embodiments described above.

Figure 19:
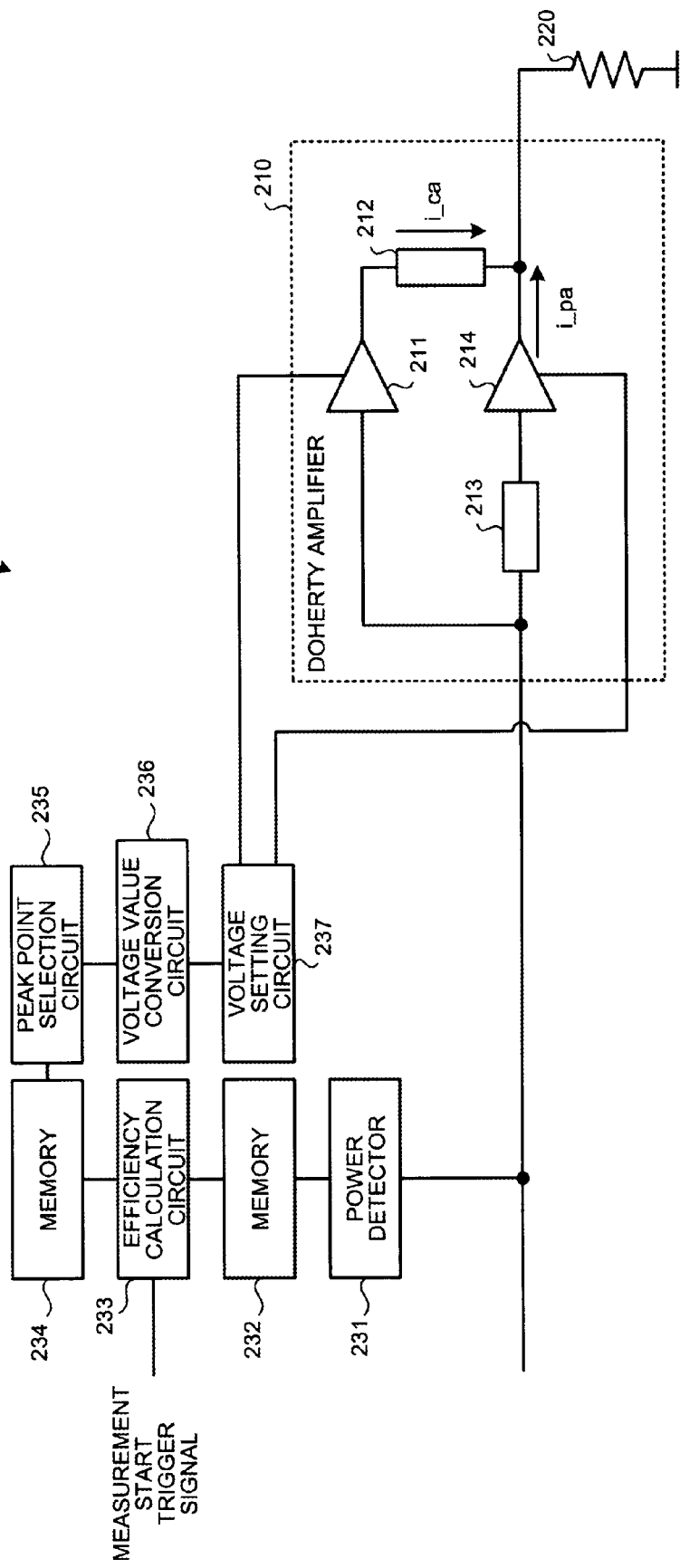
FIG. 19 is a diagram of a modification of the operation of an efficiency calculation circuit.

FIG. 19 is a diagram of a modification of the operation of the efficiency calculation circuit. In FIG. 19, components identical to the components depicted in FIG. 2 are denoted by the same reference numerals used in FIG. 2 and will not be described. As depicted in FIG. 19, a measurement start trigger signal may be input to the efficiency calculation circuit 233.

The measurement start trigger signal is a signal input when a change is made in a property affecting the instantaneous power distribution of the signal such as a modulation mode, a multiplex mode, and a transmission parameter of the signal input to the amplifying apparatus 200. The measurement start trigger signal is input to the efficiency calculation circuit 233 from a higher protocol of a communication apparatus including the amplifying apparatus 200, for example.

When the measurement start trigger signal is input, the efficiency calculation circuit 233 newly starts the measurement of instantaneous power distribution. As a result, measurement of instantaneous power distribution can be performed immediately after a change in the instantaneous power distribution of the signal so as to reflect a measurement result on the control of the Doherty amplifier 210. Therefore, when the instantaneous power distribution of the signal input to the amplifying apparatus 200 has changed, the parameters of the Doherty amplifier 210 can be set quickly according to the instantaneous power distribution after the change so as to accurately control the efficiency of amplification of the Doherty amplifier 210.

As described, the efficiency of amplification of the Doherty amplifier 210 can accurately be controlled by measuring the frequency distribution of the period immediately after a change in the property of the signal based on the measurement start trigger signal indicative of the timing of the change in mode of the signal. The modification depicted in FIG. 19 is applicable to the embodiments described above, for example.

Figure 20A:
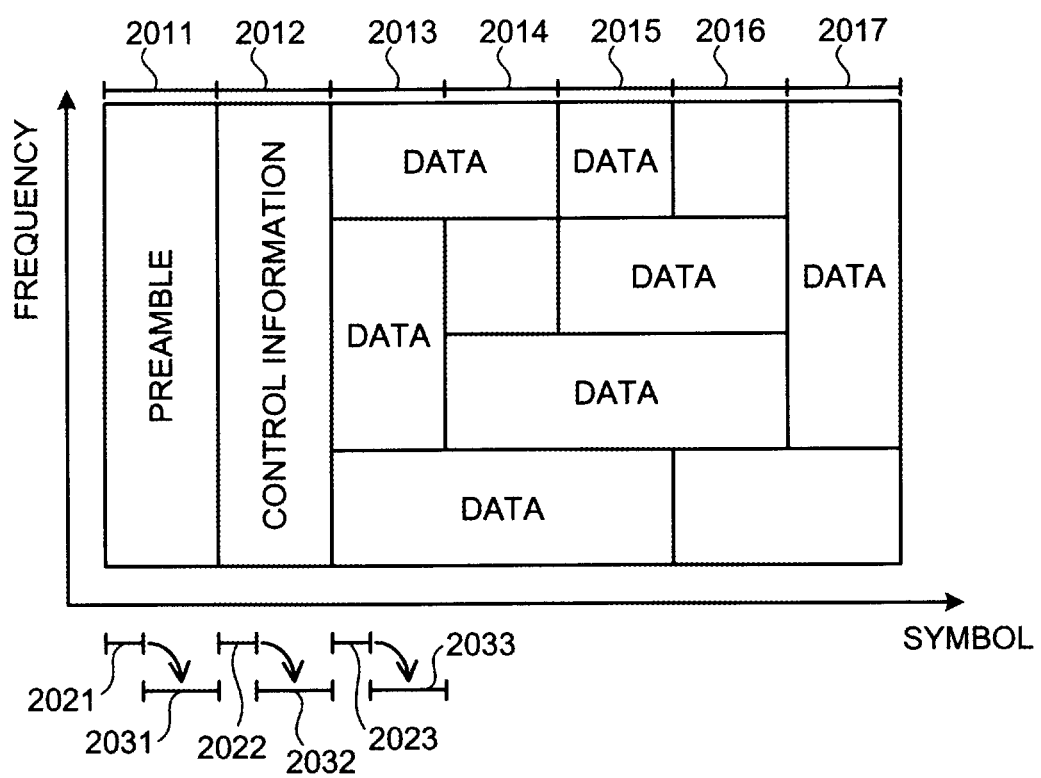
FIG. 20A is a diagram of a first modification of control of the Doherty amplifier.

FIG. 20A is a diagram of a first modification of the control of the Doherty amplifier. In FIG. 20A, by way of example, a case of the amplifying apparatus 200 amplifying OFDM signals will be described. The horizontal axis in FIG. 20A indicates a symbol (time) of a signal to be amplified by the amplifying apparatus 200. The vertical axis in FIG. 20A indicates a frequency of the signal to be amplified by the amplifying apparatus 200. As depicted in FIG. 20A, the signal to be amplified by the amplifying apparatus 200 changes in the order of a preamble symbol 2011, a control information symbol 2012, and data symbols 2013 to 2017.

For example, in the period of the preamble symbol 2011, the fluctuation of the instantaneous power distribution of the signal is small. Therefore, based on the instantaneous power distribution measured in a first section 2021 of the symbol 2011, the amplifying apparatus 200 may control the parameters of the Doherty amplifier 210 in a remaining period 2031 of the symbol 2011. In this case, the amount of processing can be reduced because it is not necessary to perform the measurement of instantaneous power distribution or the calculation of total efficiency of the Doherty amplifier 210 in the period 2031.

Similarly, based on the instantaneous power distribution measured in a first section 2022 of the control information symbol 2012, the amplifying apparatus 200 may control the parameters of the Doherty amplifier 210 in a remaining period 2032 of the symbol 2012. Based on the instantaneous power distribution measured in a first section 2023 of the data symbol 2013, the amplifying apparatus 200 may control the parameters of the Doherty amplifier 210 in a remaining period 2033 of the symbol 2013. The same applies to the symbols 2014 to 2017.

Since the format of the signal and the number of subcarriers are changed by each symbol, the instantaneous power distribution is likely to change for each symbol. Therefore, the amplifying apparatus 200 provides the control of the parameters of the Doherty amplifier 210 in the same symbol based on the instantaneous power distribution measured at the beginning of the symbol. As a result, the frequencies of the measurement of instantaneous power distribution and the calculation of total efficiency can be lowered to reduce the amount of processing.

The control depicted in FIG. 20A can be implemented, for example, in the amplifying apparatus 200 depicted in FIG. 19 by inputting the measurement start trigger signal at the start of a symbol. For example, the efficiency calculation circuit 233 measures instantaneous power distribution in the section immediately after the input of the measurement start trigger signal and does not measure instantaneous power distribution until next time the measurement start trigger signal is input. As a result, the measurement of instantaneous power distribution can be performed limited to the start of a symbol.

Figure 20B:
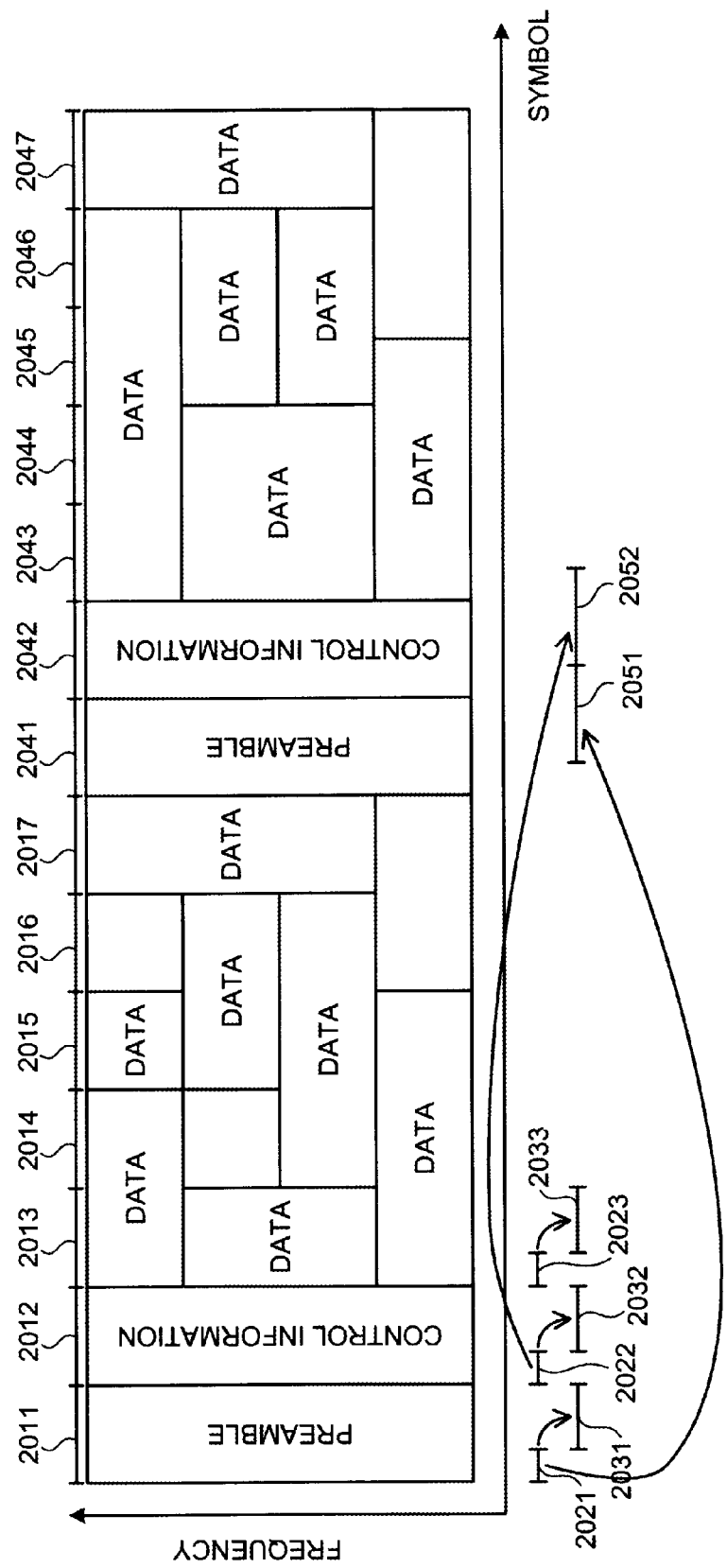
FIG. 20B is a diagram of a second modification of the control of the Doherty amplifier.

FIG. 20B is a diagram of a second modification of the control of the Doherty amplifier. In FIG. 20B, components identical to the components depicted in FIG. 20A are denoted by the same reference numerals used in FIG. 20A and will not be described. As depicted in FIG. 20B, the signal to be amplified of the amplifying apparatus 200 changes after the data symbols 2013 to 2017 in the order of a preamble symbol 2041, a control information symbol 2042, and data symbols 2043 to 2047.

For example, if the signal of the symbols 2011 to 2017 is the same signal as, or a signal similar to, the signal of the symbols 2041 to 2047, the instantaneous power distribution of the preamble symbol 2041 is likely to be close to the instantaneous power distribution of the previous preamble symbol 2011.

Therefore, based on the instantaneous power distribution measured in the first section 2021 of the symbol 2011, the amplifying apparatus 200 may control the parameters of the Doherty amplifier 210 in a section 2051 of the symbol 2041. In this case, the amount of processing can be reduced because it is not necessary to perform the measurement of instantaneous power distribution or the calculation of total efficiency of the Doherty amplifier 210 in the section 2051.

Similarly, based on the instantaneous power distribution measured in the first section 2022 of the control information symbol 2012, the amplifying apparatus 200 may control the parameters of the Doherty amplifier 210 in a section 2052 of the control information symbol 2042. In this case, the amount of processing can be reduced because it is not necessary to perform the measurement of instantaneous power distribution or the calculation of total efficiency of the Doherty amplifier 210 in the section 2052.

The modifications depicted in FIGS. 20A and 20B are applicable to the embodiments described above, for example.

Figure 21:
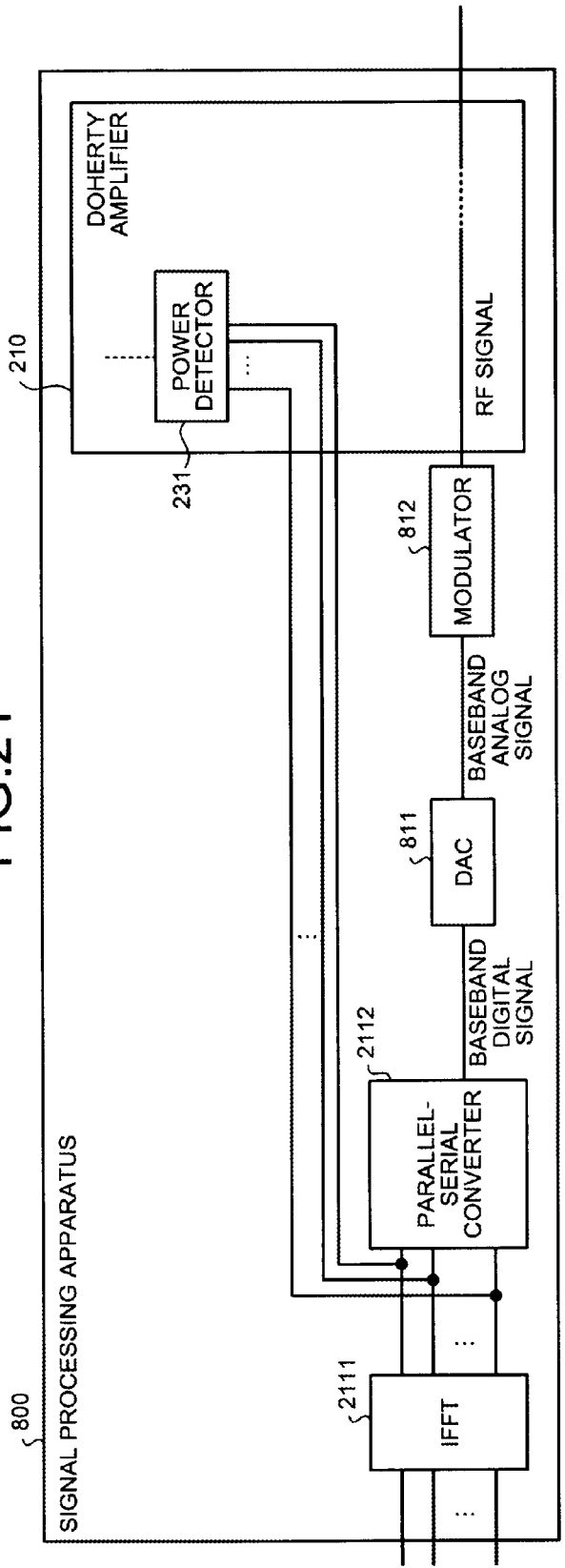
FIG. 21 is a diagram of a modification of a power detecting method.

FIG. 21 is a diagram of a modification of a power detecting method. In FIG. 21, components identical to the components depicted in FIG. 8 are denoted by the same reference numerals used in FIG. 8 and will not be described. As depicted in FIG. 21, the signal processing apparatus 800 may further include an IFFT 2111 and a parallel-serial converter 2112. To the inverse fast Fourier transform (IFFT) 2111, parallel signals are input.

The IFFT 2111 performs inverse Fourier transform of the input parallel signals. The IFFT 2111 outputs the parallel signals acquired by the inverse Fourier transform to the parallel-serial converter 2112. For example, if the signals to be amplified of the Doherty amplifier 210 are OFDM signals, the parallel signals input to the IFFT 2111 are signals indicative of data of respective frequencies (subcarriers). In this case, the signals of respective frequencies input to the IFFT 2111 are converted into signals in time sequence and output to the parallel-serial converter 2112.

The parallel-serial converter 2112 rearranges the temporally sequenced parallel signals output from the IFFT 2111, in time order. The parallel-serial converter 2112 outputs the rearranged baseband digital signals to the DAC 811. The DAC 811 converts the baseband digital signals output from the parallel-serial converter 2112 into baseband analog signals.

In this case, the power detector 231 may detect the electrical powers of the parallel signals output from the IFFT 2111 to the parallel-serial converter 2112. This enables the detection of instantaneous powers of the signals to be amplified of the Doherty amplifier 210. As described above, the power detector 231 may detect the instantaneous powers of the signals to be amplified of the Doherty amplifier 210 based on concurrently acquired parallel signals.

Figure 22:
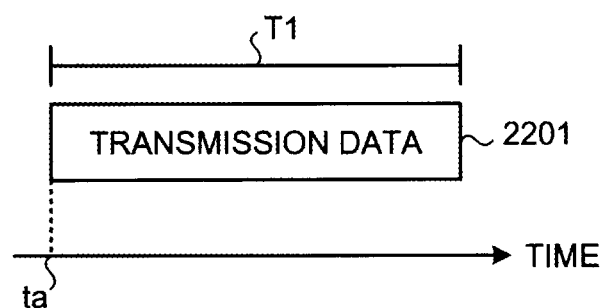
FIG. 22 is a diagram of an example of the timing of the power detecting method depicted in FIG. 21.

FIG. 22 is a diagram of an example of the timing of the power detecting method depicted in FIG. 21. The horizontal axis in FIG. 22 indicates time. Transmission data 2201 are a series of data when parallel signals are output from the IFFT 2111 at a given time, converted into serial signals by the parallel-serial converter 2112, and input via the DAC 811 and the modulator 812 to the Doherty amplifier 210. A period T1 is a period when the transmission data 2201 is input to the amplifying apparatus 200. In this case, the predetermined period described above is the period T1, for example.

As depicted in FIG. 21, if the power detector 231 detects the electrical powers of the parallel signals output from the IFFT 2111, the instantaneous powers of the transmission data 2201 in the period T1 can be acquired at start time t0 of the period T1. Therefore, for example, as compared to the case of detecting electrical powers based on serial signals converted by the parallel-serial converter 2112, the electrical powers of the transmission data 2201 in the period T1 can be detected quickly. Therefore, the parameters of the Doherty amplifier 210 can be controlled quickly in response to a change in the instantaneous power distribution of the signals to be amplified. Therefore, the efficiency of amplification of the Doherty amplifier 210 can be controlled accurately when the mode, etc. of the signals to be amplified is changed.

If the signals to be amplified by the amplifying apparatus 200 are signals of one system serially converted from signals of multiple systems, the instantaneous powers or the distribution of the instantaneous powers of the signals of multiple systems at a given time are measured. As a result, the frequency distribution of the signals to be amplified in the predetermined period can be measured before the end time of the predetermined period. The modifications depicted in FIGS. 21 and 22 are applicable to the embodiments described above, for example.

Figure 23:
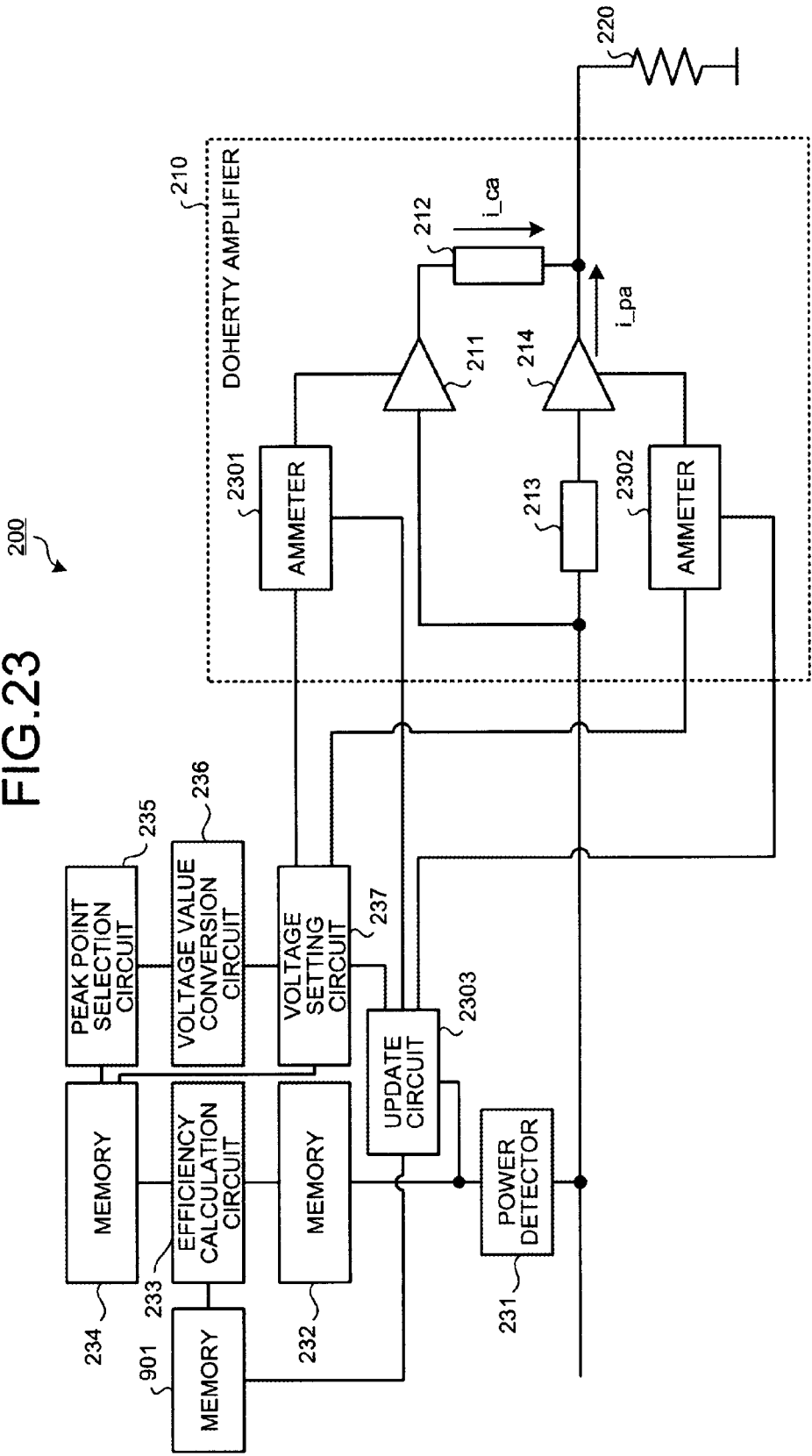
FIG. 23 is a diagram of a first modification of the amplifying apparatus.

FIG. 23 is a diagram of a first modification of the amplifying apparatus. In FIG. 23, components identical to the components depicted in FIG. 9 are denoted by the same reference numerals used in FIG. 9 and will not be described. As depicted in FIG. 23, the amplifying apparatus 200 may further include ammeters 2301, 2302, and an update circuit 2303 in addition to the configuration depicted in FIG. 9. The update circuit 2303 can be implemented by a digital circuit such as an FPGA and a CPU, for example.

The ammeter 2301 measures the value of the current supplied by the voltage setting circuit 237 to the carrier amplifier 211. The ammeter 2301 outputs the measured current value to the update circuit 2303. The ammeter 2302 measures the value of the current supplied by the voltage setting circuit 237 to the peak amplifier 214. The ammeter 2302 outputs the measured current value to the update circuit 2303.

The update circuit 2303 acquires present instantaneous power of the signal input to the amplifying apparatus 200, present setting voltages of the carrier amplifier 211 and the peak amplifier 214, and present current values of the carrier amplifier 211 and the peak amplifier 214.

For example, the update circuit 2303 can acquire the present instantaneous power from the power detector 231. The update circuit 2303 can acquire the present setting voltages of the carrier amplifier 211 and the peak amplifier 214 from the voltage setting circuit 237. The update circuit 2303 can acquire the present current values of the carrier amplifier 211 and the peak amplifier 214 from the ammeters 2301 and 2302, respectively. The update circuit 2303 correlates and writes into the memory 901 (storage unit), the acquired instantaneous power and the present setting voltages and present current values of the carrier amplifier 211 and the peak amplifier 214.

When the present instantaneous power is written by the power detector 231 into the memory 232, the efficiency calculation circuit 233 reads the written present instantaneous power. The efficiency calculation circuit 233 then calculates the instantaneous efficiency of the Doherty amplifier 210 at the read present instantaneous power. The efficiency calculation circuit 233 stores into the memory 901, the calculated instantaneous efficiency in a manner correlating the calculated instantaneous efficiency with the latest instantaneous power, setting voltages, and current values written by the update circuit 2303 into the memory 901. As a result, the correlation information 1000 (see, e.g., FIG. 10) correlating the instantaneous efficiency η(v_ca, v_pa) with each combination of the voltages v_ca and v_pa stored in the memory 901 can be updated based on actual measurement values.

As described, actual current values at a given instantaneous power may be measured to replace current values of the memory 901 with the actual measurement values. As a result, for example, the parameters of the Doherty amplifier 210 can be controlled according to a change in environment, etc. of the amplifying apparatus 200 to suppress fluctuations of the efficiency of amplification by the Doherty amplifier 210 due to the change in environment, etc. of the amplifying apparatus 200.

FIG. 24 is a diagram of a second modification of the amplifying apparatus. In FIG. 24, components identical to the components depicted in FIG. 13 or 23 are denoted by the same reference numerals used in FIGS. 13 and 23, and will not be described. As depicted in FIG. 24, the amplifying apparatus 200 may further include the ammeters 2301, 2302, and the update circuit 2303 in addition to the configuration depicted in FIG. 13. In the configuration depicted in FIG. 24, for example, the parameters of the Doherty amplifier 210 can be controlled depending on a change in environment, etc. of the amplifying apparatus 200 to suppress fluctuations of the efficiency of amplification of the Doherty amplifier 210 due to the change in environment, etc. of the amplifying apparatus 200.

FIG. 25 is a flowchart of an example of the update operation of the amplifying apparatus depicted in FIG. 23 or 24. Description will be made of a case where initial values of the correlation information determined, for example, at the design stage, etc. are stored in the memory 901 in the initial state, for example. First, the update circuit 2303 acquires the present instantaneous power of the signal to be amplified and the present setting voltages and current values of the carrier amplifier 211 and the peak amplifier 214 (step S2501).

The update circuit 2303 correlates and writes into the memory 901, the instantaneous power and the present setting voltages and current values of the carrier amplifier 211 and the peak amplifier 214 acquired at step S2501 (step S2502).

The efficiency calculation circuit 233 calculates the instantaneous efficiency of the Doherty amplifier 210 based on the present instantaneous power detected and written by the power detector 231 into the memory 232 (step S2503). The efficiency calculation circuit 233 correlates and stores into the memory 901, the instantaneous efficiency calculated at step S2503 and the information written at step S2502 (step S2504), and the operation returns to step S2501.

With the steps described, the correlation information 1000 correlating the instantaneous efficiency η(v_ca, v_pa) with each combination of the voltages v_ca and v_pa stored in the memory 901 can be updated based on actual measurement values.

For example, the amplifying apparatus 200 depicted in FIG. 24 may first control the parameters of the Doherty amplifier 210 based on the total efficiency calculated for each intermediate efficiency peak point α. In this case, configuration may be such that the correlation information of the memory 901 is not stored in advance. As a result of the control based on the total efficiency calculated for each intermediate efficiency peak point α, the correlation information 1000 correlating the instantaneous efficiency η with each combination of the voltages v_ca and v_pa after the control, is stored in the memory 901. The amplifying apparatus 200 can then control the parameters of the Doherty amplifier 210 based on the period efficiency calculated for each combination of the voltages v_ca and v_pa based on the stored correlation information 1000.

The modifications depicted in FIGS. 23 to 25 are applicable to the second embodiment described above, for example.

If the measurement sections of instantaneous power have sections overlapping with each other, for example, as depicted in FIG. 4, when the total efficiency based on instantaneous power distribution of a measurement section is calculated, a calculation result of total efficiency based on instantaneous power distribution of the previous measurement section can be utilized.

For example, it is assumed that the times included in the measurement section 421 depicted in FIG. 4 are times t(1), t(2), . . . , t(n). It is assumed that the times included in the measurement section 422 next to the measurement section 421 are times t(3), t(4), . . . , t(n+2). It is assumed that the instantaneous powers at the times t(1), t(2), . . . , t(n) of the measurement section 421 are instantaneous powers P(1), P(2), . . . , P(n).

It is assumed that the instantaneous efficiencies of the Doherty amplifier 210 at the instantaneous powers P(1), P(2), . . . , P(n) of the measurement section 421 are η(1), η(2), . . . , η(n). It is assumed that the total efficiency of the Doherty amplifier 210 based on the instantaneous efficiencies $\eta(1), \eta(2), \ldots, \eta(n)$ of the measurement section 421 is $\eta t$.

It is assumed that the instantaneous efficiencies of the Doherty amplifier 210 at the instantaneous powers $P(3), P(4), \ldots, P(n+2)$ of the measurement section 422 are $\eta(3), \eta(4), \ldots, \eta(n+2)$. In this case, the total efficiency $\eta t\_new$ of the Doherty amplifier 210 based on the instantaneous efficiencies $\eta(3), \eta(4), \ldots, \eta(n+2)$ of the measurement section 422 can be expressed by, for example, Equation (4).

$$\eta t\_new = \eta t - P(1) \cdot \eta(1) - P(2) \cdot \eta(2) + P(n+1) \cdot \eta(n+1) + P(n+2) \cdot \eta(n+2) \tag{4}$$

The efficiency calculation circuit 233 can calculate the total efficiency $\eta t\_new$ with Equation (4). In other words, the efficiency calculation circuit 233 subtracts efficiency $P(1) \cdot \eta(1)$ and efficiency $P(2) \cdot \eta(2)$ at the times $t(1)$ and $t(2)$ of the measurement section 421 not included in the measurement section 422 from the calculated total efficiency $\eta t$ of the measurement section 421. The efficiency calculation circuit 233 adds efficiency $P(n+1) \cdot \eta(n+1)$ and efficiency $P(n+2) \cdot \eta(n+2)$ at the times $t(n+1)$ and $t(n+2)$ of the measurement section 422 not included in the measurement section 421 to the total efficiency $\eta t$ after the subtraction.

As described, the efficiency calculation circuit 233 calculates the total efficiency in the measurement section 422 based on the total efficiency calculated for the measurement section 421 before the measurement result 422 and the total efficiency in the periods of the measurement sections 421 and 422 not overlapping with each other. As a result, the amount of processing can be reduced as compared to calculating the total efficiency of the measurement section 422 based on the respective efficiencies at the times $t(3), t(4), \ldots, t(n+2)$ of the measurement section 422, for example.

This modification of the calculation of total efficiency is applicable to the first and second embodiments described above, for example.

As described, according to the amplifying apparatus and the control method, even if properties of signals change, the efficiency of amplification can be controlled accurately by controlling the parameters of the amplifying unit 110 based on distribution of instantaneous power of signals to be amplified.

For example, if the parameters are controlled based on average power, the same parameters are set for states having the same average power and different instantaneous power distributions and therefore, the efficiency of amplification cannot be increased. In contrast, by controlling the parameters based on distribution of instantaneous power, the parameters further increasing the efficiency of amplification according to distribution of instantaneous power can be set for each of the states having the same average power and different instantaneous power distributions.

One aspect of the present invention enables accurate control of the efficiency of amplification.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An amplifying apparatus comprising:
   an amplifying unit that includes a plurality of amplifiers coupled in parallel;
   a measuring unit that measures in a predetermined period, frequency distribution of any one among instantaneous power and instantaneous voltage of a signal amplified by the amplifying unit;
   a calculating unit that calculates for a plurality of candidate values of a predetermined parameter of the amplifying unit, efficiency of amplification that is performed by the amplifying unit and based on the frequency distribution; and
   a controller that controls the predetermined parameter, based on the efficiency calculated for the candidate values by the calculating unit, wherein
   the calculating unit calculates the efficiency of amplification, based on information indicative of characteristics of efficiency of amplification for the candidate values of the predetermined parameter and the any one among the instantaneous power and the instantaneous voltage of the signal amplified by the amplifying unit.

2. The amplifying apparatus according to claim 1, wherein the controller controls the predetermined parameter using a candidate value that is among the candidate values of the predetermined parameter and for which the calculated efficiency satisfies a predetermined condition.

3. The amplifying apparatus according to claim 1, wherein
   the amplifying unit has a plurality of local maximum points in characteristics of the efficiency of amplification of output voltage,
   the predetermined parameter includes a non-maximum intermediate voltage among a plurality of the output voltages corresponding to the local maximum points, and
   the controller controls the intermediate voltage by changing a supply voltage to at least one amplifier among the amplifiers of the amplifying unit.

4. The amplifying apparatus according to claim 1, wherein the predetermined parameter includes a supply voltage to at least one amplifier among the amplifiers of the amplifying unit.

5. The amplifying apparatus according to claim 4, wherein
   the amplifying unit has a plurality of local maximum points in characteristics of the efficiency of amplification of direct-current voltage on an output side,
   the predetermined parameter includes a non-maximum intermediate voltage among a plurality of the output voltages corresponding to the local maximum points,
   the calculating unit calculates for a plurality of candidate values of the intermediate voltage, the efficiency of amplification that is based on the frequency distribution and calculates for a plurality of candidate values of the supply voltage, the efficiency of amplification that is based on the frequency distribution, and
   the controller controls the supply voltage, based on any one among the efficiency calculated for the candidate values of the intermediate voltage and the efficiency calculated for the candidate values of the supply voltage.

6. The amplifying apparatus according to claim 1, wherein the predetermined period includes cyclic periods, and the measuring unit measures the frequency distribution for each of the cyclic periods.

7. The amplifying apparatus according to claim 6, wherein successive periods among the cyclic periods include successive periods that overlap.

8. The amplifying apparatus according to claim 1, wherein
the measuring unit measures the frequency distribution of each cyclic first period and simultaneously measures the frequency distribution of each of cyclic second period, the cyclic second periods being respectively shorter than the first periods, the calculating unit calculates for the candidate values, first efficiency of amplification that is based on the frequency distribution of the first period and second efficiency of amplification that is based on the frequency distribution of the second period, and the controller, when a change in the frequency distribution of instantaneous power of the signals is detected based on the second efficiency during first control in which the predetermined parameter is controlled based on the first efficiency, makes a switch to second control in which the predetermined parameter is controlled based on the second efficiency.

9. The amplifying apparatus according to claim 8, wherein the controller, after a change in the frequency distribution of instantaneous power of the signal is detected and switch is made to the second control, performs the first control that is based on the first efficiency calculated based on the frequency distribution of the first period started after detection of the change in the frequency distribution of the instantaneous power of the signal.

10. The amplifying apparatus according to claim 1, wherein the measuring unit measures based on information indicative of a timing of a change in a property of the signal, the frequency distribution of a period that is immediately after the change in the property of the signal.

11. The amplifying apparatus according to claim 10, wherein the measuring unit, upon measuring the frequency distribution of the period that is immediately after the change in the property of the signal and based on the information indicative of the timing of a change, does not measure the frequency distribution until next time the property of the signal changes.

12. The amplifying apparatus according to claim 1, wherein
the signal is a signal of a single system, serially converted from signals of multiple systems, and the measuring unit measures instantaneous powers or instantaneous voltages of the signals of the multiple systems at a predetermined time to measure the frequency distribution of the signals of the single systems in the predetermined period.

13. The amplifying apparatus according to claim 4, wherein
the controller stores into a storage unit, correlation information correlating the controlled supply voltage, the instantaneous power or the instantaneous voltage, and the efficiency of amplification at the instantaneous power or the instantaneous voltage, and the calculating unit calculates based on the correlation information stored in the storage unit and for the candidate values, the efficiency of amplification that is based on the frequency distribution.

14. The amplifying apparatus according to claim 5, wherein
the controller controls the supply voltage, based on the efficiency of amplification that is based on the frequency distribution calculated for the candidate values of the intermediate voltage, the controller stores into a storage unit, correlation information correlating the controlled supply voltage, the instantaneous power or the instantaneous voltage, and the efficiency of amplification at the instantaneous power or the instantaneous voltage, and the controller controls the supply voltage, based on the efficiency of amplification that is based on the frequency distribution calculated for the candidate values of the supply voltage and based on the correlation information stored in the storage unit.

15. The amplifying apparatus according to claim 1, wherein the calculating unit calculates efficiency of amplification performed in a first predetermined period, the calculating unit calculating the efficiency, based on efficiency of amplification calculated based on the frequency distribution of a second predetermined period that is before the first predetermined period and has a period that overlaps a period of the first predetermined period, and calculates efficiency of amplification performed in periods of the first predetermined period and the second predetermined period, the periods not overlapping.

16. The amplifying apparatus according to claim 1, wherein the amplifying unit includes a first amplifier, a first transmission line coupled in series downstream from the first amplifier and having a length ¼ the center wavelength of the signal, a second amplifier coupled in parallel to the first amplifier and the first transmission line, and a second transmission line coupled in series upstream to the second amplifier and having the length.

17. A control method of an amplifying apparatus comprising an amplifying unit that includes a plurality of amplifiers coupled in parallel, the control method comprising:
measuring in a predetermined period, frequency distribution of any one among instantaneous power and instantaneous voltage of a signal amplified by the amplifying unit;

calculating for a plurality of candidate values of a predetermined parameter of the amplifying unit, efficiency of amplification that is performed by the amplifying unit and based on the frequency distribution; and controlling the predetermined parameter, based on the efficiency calculated for the candidate values, wherein the calculating includes calculating the efficiency of amplification, based on information indicative of characteristics of efficiency of amplification for the candidate values of the predetermined parameter and any one among the instantaneous power and the instantaneous voltage of the signal amplified at the amplifying.

* * * * *